(12) United States Patent
Nasuno et al.

(10) Patent No.: US 8,093,684 B2
(45) Date of Patent: Jan. 10, 2012

(54) IRON SULFIDE SEMICONDUCTOR DOPED WITH MG OR ZN, JUNCTION DEVICES AND PHOTOELECTRIC CONVERTER COMPRISING SAME

(75) Inventors: Yoshiyuki Nasuno, Kashihara (JP); Noriyoshi Kohama, Katsuragi (JP); Kazuhito Nishimura, Katsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 980 days.

(21) Appl. No.: 11/651,086

(22) Filed: Jan. 9, 2007

(65) Prior Publication Data
US 2007/0163635 A1 Jul. 19, 2007

(30) Foreign Application Priority Data

Jan. 16, 2006 (JP) ................. P2006-007130
Aug. 1, 2006 (JP) ................. P2006-209716

(51) Int. Cl.
*H01L 29/24* (2006.01)
*H01L 29/36* (2006.01)
*H01L 31/032* (2006.01)
*H01L 31/036* (2006.01)

(52) U.S. Cl. ........ 257/607; 257/613; 257/439; 257/463; 257/E29.003; 257/E29.079; 257/E29.1; 257/E29.109; 257/E31.031; 257/E31.04

(58) Field of Classification Search .......... 257/102, 257/43, 431, E31.001, E31.018, E31.031, 257/436, 439, 441, 442, 461, 613, 614, 615, 257/616, E31.003, E31.004, E31.015, E31.016, 257/E31.017, E31.026, E31.027, E31.028, 257/E31.029, E31.02, 463, 607, E31.04, 257/E29.003, E29.004, E29.068, E29.079, 257/E29.1, E29.109

See application file for complete search history.

(56) References Cited

U.S. PATENT DOCUMENTS

| 4,649,227 | A | 3/1987 | Tributsch et al. |
| 4,731,307 | A | 3/1988 | Guidotti |
| 6,635,942 | B2 * | 10/2003 | La Vecchia .......... 257/439 |
| 6,844,563 | B2 * | 1/2005 | Emoto .......... 250/576 |
| 6,891,213 | B1 * | 5/2005 | Noble .......... 257/296 |
| 2006/0049478 | A1 * | 3/2006 | Yamada et al. .......... 257/458 |

FOREIGN PATENT DOCUMENTS

JP 61-106499 5/1986

(Continued)

OTHER PUBLICATIONS

Altermatt et al., *Specifying targets of future research in photovoltaic devices containing pyrite ($FeS_2$) by numerical modelling*, Solar Energy Materials & Solar Cells, 71(2002), 181-195.

(Continued)

*Primary Examiner* — Samuel A Gebremariam
*Assistant Examiner* — Andrew O. Arena
(74) *Attorney, Agent, or Firm* — Nixon & Vanderhye P.C.

(57) ABSTRACT

The semiconductor of the present invention has iron sulfide and a forbidden band control element contained in the iron sulfide. The forbidden band control element has a property capable of controlling the forbidden band of iron sulfide on the basis of the number density of the forbidden band control element in the iron sulfide. An n-type semiconductor is manufactured by incorporating a group 13 element of the IUPAC system into iron sulfide. Moreover, a p-type semiconductor is manufactured by incorporating a group Ia element into iron sulfide. A semiconductor junction device or a photoelectric converter is manufactured by using the n-type semiconductor and the p-type semiconductor.

27 Claims, 20 Drawing Sheets

| | TYPE OF COMPOUND | CONCENTRATION (mol/l) | CONDUCTIVE TYPE | Mg/Fe RATIO (%) | FORBIDDEN BANDWIDTH (eV) |
|---|---|---|---|---|---|
| COMPARATIVE EXAMPLE 101 | --- | --- | p | --- | 0.95 |
| EXAMPLE 101 | $MgCl_2$ | 0.05 | p | 0.1 | 1.00 |
| EXAMPLE 102 | $MgCl_2$ | 0.25 | p | 0.5 | 1.05 |
| EXAMPLE 103 | $MgCl_2$ | 0.5 | p | 1 | 1.16 |
| EXAMPLE 104 | $MgCl_2$ | 5 | p | 10 | 1.27 |
| EXAMPLE 105 | $MgCl_2$ | 10 | p | 20 | 1.28 |
| EXAMPLE 106 | $MgCl_2$ | 22.5 | p | 45 | 1.26 |

FOREIGN PATENT DOCUMENTS

| | | |
|---|---|---|
| JP | 07-089719 | 4/1995 |
| JP | 07-215704 | 5/1995 |
| JP | 2002-516651 | 6/2002 |

OTHER PUBLICATIONS

Ferrer et al, "Preparation of N-Type Doped FES2 Thin Films", Solid State Communications, Oxford, GB, vol. 89, No. 4, Jan. 1994, pp. 349-352.

Ferrer et al, "A Note on the Hall Mobility and Carrier Concentration in Pyrite Thin Films", Soar Energy Materials and Solar Cells, Elsevier Science Publishers, Amsterdam, NL, vol. 76, No. 2, Mar. 1, 2003, pp. 183-188.

Blenk, "Herstellung and Charakterisierung von FeS2 (Pyrit) für die Photovoltaik", 1995, Hartung-Gore Verlag, Konstanz, XP002430859, pp. 63-77.

Ferrer et al, "Photoelectrochemical Response and Optical Absorption of Pyrite ($FeS_2$) Natural Single Crystals", Solid State Communications, vol. 81, No. 5, 1992, pp. 371-374.

EP Search Report issued Apr. 29, 2011 in corresponding EP Application No. 10012446.0.

S. Kar, et al., "Wet chemical synthesis of iron pyrite and characterization by Mössbauer spectroscopy", Materials Letters, vol. 58, No. 22-23, pp. 2886-2889, Sep. 1, 2004.

S. Nakamura et al., "Electrodeposition of pyrite ($FeS_2$) thin films for photovoltaic cells", Solar Energy Materials & Solar Cells, vol. 65, No. 1-4, pp. 79-85, Jan. 1, 2001.

EP Search Report issued Apr. 29, 2011 in corresponding EP Application No. 10012447.8.

K. Buker et al, "Photoelectrochemistry of Highly Zn-Doped Pyrite as Compared with Isostructural $FeS_2$"., Journal of the Electrochemical Society, vol. 146, No. 1, pp. 261-265, 1999.

S. Fletcher et al., "Defect Chemistry and Electrical Properties of Iron-pyrite ($FeS_{2-x}$)", Non-Stoichiometry in Semiconductors, pp. 87-92, Jan. 1, 1992.

\* cited by examiner

Fig.3

| | TYPE OF COMPOUND | CONCENTRATION (mol/l) | CONDUCTIVE TYPE | GROUP IIIb ELEMENT CONCENTRATION ($cm^{-3}$) | CARRIER DENSITY ($cm^{-3}$) | Eg (eV) |
|---|---|---|---|---|---|---|
| COMPARATIVE EXAMPLE 1 | --- | --- | p | --- | $1 \times 10^{17}$ | 0.95 |
| EXAMPLE 1 | $AlCl_3$ | 0.00001 | n | $4 \times 10^{18}$ | $3 \times 10^{17}$ | 0.98 |
| EXAMPLE 2 | $AlCl_3$ | 0.0001 | n | $4 \times 10^{19}$ | $2 \times 10^{18}$ | 1.02 |
| EXAMPLE 3 | $AlCl_3$ | 0.0005 | n | $2 \times 10^{20}$ | $1 \times 10^{19}$ | 1.09 |
| EXAMPLE 4 | $AlCl_3$ | 0.005 | n | $2 \times 10^{21}$ | $1 \times 10^{20}$ | 1.18 |
| EXAMPLE 5 | $AlCl_3$ | 0.015 | n | $5 \times 10^{21}$ | $1 \times 10^{20}$ | 1.20 |
| EXAMPLE 6 | $Ga_2O_3 \cdot nH_2O$ | 0.0005 | n | $2 \times 10^{20}$ | $4 \times 10^{19}$ | 0.95 |
| EXAMPLE 7 | $InCl_3 \cdot nH_2O$ | 0.0005 | n | $2 \times 10^{20}$ | $7 \times 10^{18}$ | 0.93 |

Fig.5

| | SPRAYING SOLUTION FOR p-TYPE | SPRAYING SOLUTION FOR n-TYPE | PHOTOELECTRIC CONVERSION EFFICIENCY (%) |
|---|---|---|---|
| EXAMPLE 8 | COMPARATIVE EXAMPLE 1 | EXAMPLE 1 | 2.2 |
| EXAMPLE 9 | COMPARATIVE EXAMPLE 1 | EXAMPLE 2 | 2.7 |
| EXAMPLE 10 | COMPARATIVE EXAMPLE 1 | EXAMPLE 3 | 3.0 |
| EXAMPLE 11 | COMPARATIVE EXAMPLE 1 | EXAMPLE 4 | 3.1 |
| EXAMPLE 12 | COMPARATIVE EXAMPLE 1 | EXAMPLE 5 | 3.0 |
| EXAMPLE 13 | COMPARATIVE EXAMPLE 1 | EXAMPLE 6 | 2.9 |
| EXAMPLE 14 | COMPARATIVE EXAMPLE 1 | EXAMPLE 7 | 2.8 |

Fig. 9

| | TYPE OF COMPOUND | CONCENTRATION (mol/l) | CONDUCTIVE TYPE | Mg/Fe RATIO (%) | FORBIDDEN BANDWIDTH (eV) |
|---|---|---|---|---|---|
| COMPARATIVE EXAMPLE 101 | --- | --- | p | --- | 0.95 |
| EXAMPLE 101 | $MgCl_2$ | 0.05 | p | 0.1 | 1.00 |
| EXAMPLE 102 | $MgCl_2$ | 0.25 | p | 0.5 | 1.05 |
| EXAMPLE 103 | $MgCl_2$ | 0.5 | p | 1 | 1.16 |
| EXAMPLE 104 | $MgCl_2$ | 5 | p | 10 | 1.27 |
| EXAMPLE 105 | $MgCl_2$ | 10 | p | 20 | 1.28 |
| EXAMPLE 106 | $MgCl_2$ | 22.5 | p | 45 | 1.26 |

Fig. 10

| | TYPE OF COMPOUND | CONCENTRATION (mol/l) | CONDUCTIVE TYPE | INTRA-FILM ELEMENT CONCENTRATION ($cm^{-3}$) | CARRIER DENSITY ($cm^{-3}$) |
|---|---|---|---|---|---|
| COMPARATIVE EXAMPLE 101 | --- | --- | p | --- | $1 \times 10^{17}$ |
| EXAMPLE 107 | NaCl | 0.5 | p | $2 \times 10^{20}$ | $9 \times 10^{19}$ |
| EXAMPLE 108 | $AlCl_3$ | 0.5 | n | $2 \times 10^{20}$ | $8 \times 10^{18}$ |

Fig. 11

| | KIND OF n-TYPE SEMICONDUCTOR | PRESENCE OR ABSENCE OF Mg IN n-TYPE SEMICONDUCTOR | RELATION OF FORBIDDEN BANDWIDTH | CONVERSION EFFICIENCY (%) |
|---|---|---|---|---|
| EXAMPLE 109 | $FeS_2$ : Al | PRESENT | $Eg1 < Eg2$ | 2.9 |
| EXAMPLE 110 | $FeS_2$ : Al | PRESENT | $Eg1 > Eg2$ | 2.5 |
| EXAMPLE 111 | ZnO | ABSENT | $Eg1 < Eg2$ | 2.7 |
| EXAMPLE 112 | ZnO | PRESENT | $Eg1 < Eg2$ | 3.0 |

Fig. 15

| | TYPE OF COMPOUND | CONCENTRATION (mol/l) | CONDUCTIVE TYPE | Zn/Fe RATIO (%) | FORBIDDEN BANDWIDTH (eV) |
|---|---|---|---|---|---|
| COMPARATIVE EXAMPLE 102 | --- | --- | p | --- | 0.95 |
| EXAMPLE 113 | $ZnCl_2$ | 0.5 | p | 1 | 0.97 |
| EXAMPLE 114 | $ZnCl_2$ | 5 | p | 10 | 1.01 |
| EXAMPLE 115 | $ZnCl_2$ | 10 | p | 20 | 1.10 |
| EXAMPLE 116 | $ZnCl_2$ | 15 | p | 30 | 1.23 |
| EXAMPLE 117 | $ZnCl_2$ | 20 | p | 40 | 1.21 |
| EXAMPLE 118 | $ZnCl_2$ | 22.5 | p | 45 | 1.19 |

Fig.16

| | TYPE OF COMPOUND | CONCENTRATION (mol/l) | CONDUCTIVE TYPE | INTRA-FILM ELEMENT CONCENTRATION ($cm^{-3}$) | CARRIER DENSITY ($cm^{-3}$) |
|---|---|---|---|---|---|
| COMPARATIVE EXAMPLE 102 | --- | --- | p | --- | $1 \times 10^{17}$ |
| EXAMPLE 119 | NaCl | 0.5 | p | $2 \times 10^{20}$ | $8 \times 10^{18}$ |
| EXAMPLE 120 | AlCl$_3$ | 0.5 | n | $2 \times 10^{20}$ | $7 \times 10^{18}$ |

Fig.17

| | KIND OF n-TYPE SEMICONDUCTOR | PRESENCE OR ABSENCE OF Zn IN n-TYPE SEMICONDUCTOR | RELATION OF FORBIDDEN BANDWIDTH | CONVERSION EFFICIENCY (%) |
|---|---|---|---|---|
| EXAMPLE 121 | $FeS_2:Al$ | PRESENT | $Eg1 < Eg2$ | 2.7 |
| EXAMPLE 122 | $FeS_2:Al$ | PRESENT | $Eg1 > Eg2$ | 2.5 |
| EXAMPLE 123 | $FeS_2:Al$ | ABSENT | $Eg1 > Eg2$ | 2.1 |
| EXAMPLE 124 | $ZnO$ | PRESENT | $Eg1 < Eg2$ | 2.9 |

Fig.20

| | TYPE OF COMPOUND | CONCENTRATION (mol/l) | CONDUCTIVE TYPE | GROUP Ia ELEMENT CONCENTRATION (cm$^{-3}$) | CARRIER DENSITY (cm$^{-3}$) | PL EMISSION INTENSITY (ARBITRARY UNIT) |
|---|---|---|---|---|---|---|
| COMPARATIVE EXAMPLE 103 | --- | --- | p | --- | $1 \times 10^{16}$ | 1 |
| EXAMPLE 125 | NaCl | 0.00001 | p | $4 \times 10^{15}$ | $8 \times 10^{15}$ | 3 |
| EXAMPLE 126 | NaCl | 0.0001 | p | $4 \times 10^{16}$ | $5 \times 10^{15}$ | 4 |
| EXAMPLE 127 | NaCl | 0.001 | p | $4 \times 10^{17}$ | $5 \times 10^{16}$ | 5 |
| EXAMPLE 128 | NaCl | 0.005 | p | $2 \times 10^{18}$ | $1 \times 10^{17}$ | 6 |
| EXAMPLE 129 | NaCl | 0.05 | p | $2 \times 10^{19}$ | $1 \times 10^{18}$ | 5 |
| EXAMPLE 130 | NaCl | 0.5 | p | $2 \times 10^{20}$ | $1 \times 10^{19}$ | 3 |
| EXAMPLE 131 | KCl | 0.005 | p | $2 \times 10^{18}$ | $3 \times 10^{17}$ | 5 |
| EXAMPLE 132 | LiCl | 0.005 | p | $2 \times 10^{18}$ | $1 \times 10^{17}$ | 5 |

Fig.22

| | SPRAYING SOLUTION FOR p-TYPE | SPRAYING SOLUTION FOR n-TYPE | | PHOTOELECTRIC CONVERSION EFFICIENCY (%) |
|---|---|---|---|---|
| | | TYPE OF COMPOUND | CONCENTRATION (mol/l) | |
| EXAMPLE 133 | EXAMPLE 125 | AlCl$_3$ | 0.25 | 2.7 |
| EXAMPLE 134 | EXAMPLE 126 | AlCl$_3$ | 0.25 | 2.9 |
| EXAMPLE 135 | EXAMPLE 127 | AlCl$_3$ | 0.25 | 3.3 |
| EXAMPLE 136 | EXAMPLE 128 | AlCl$_3$ | 0.25 | 3.5 |
| EXAMPLE 137 | EXAMPLE 129 | AlCl$_3$ | 0.25 | 2.7 |
| EXAMPLE 138 | EXAMPLE 130 | AlCl$_3$ | 0.25 | 2.3 |
| EXAMPLE 139 | EXAMPLE 131 | AlCl$_3$ | 0.25 | 3.2 |
| EXAMPLE 140 | EXAMPLE 132 | AlCl$_3$ | 0.25 | 3.1 |
| EXAMPLE 141 | EXAMPLE 128 | CoCl$_3$ | 0.25 | 2.0 |
| EXAMPLE 142 | EXAMPLE 128 | B$_2$O$_3$ | 0.25 | 2.7 |
| EXAMPLE 143 | EXAMPLE 128 | Ga$_2$O$_3$·nH$_2$O | 0.25 | 3.3 |
| EXAMPLE 144 | EXAMPLE 128 | InCl$_3$·nH$_2$O | 0.25 | 3.4 |

Fig.24

| | SPRAY SOLUTION FOR p+-TYPE | SPRAYING SOLUTION FOR p-TYPE | SPRAYING SOLUTION FOR n-TYPE | PHOTOELECTRIC CONVERSION EFFICIENCY (%) |
|---|---|---|---|---|
| EXAMPLE 145 | EXAMPLE 127 | EXAMPLE 126 | EXAMPLE 134 | 3.0 |
| EXAMPLE 146 | EXAMPLE 128 | EXAMPLE 126 | EXAMPLE 134 | 3.3 |
| EXAMPLE 147 | EXAMPLE 129 | EXAMPLE 126 | EXAMPLE 134 | 3.4 |
| EXAMPLE 148 | EXAMPLE 130 | EXAMPLE 126 | EXAMPLE 134 | 3.6 |
| EXAMPLE 149 | EXAMPLE 131 | EXAMPLE 126 | EXAMPLE 134 | 3.7 |
| EXAMPLE 150 | EXAMPLE 132 | EXAMPLE 126 | EXAMPLE 134 | 3.7 |

US 8,093,684 B2

IRON SULFIDE SEMICONDUCTOR DOPED WITH MG OR ZN, JUNCTION DEVICES AND PHOTOELECTRIC CONVERTER COMPRISING SAME

CROSS-REFERENCE TO RELATED APPLICATIONS

This Nonprovisional application claims priority under 35 U.S.C. §119(a) on patent application No. 2006-7130 filed in Japan on Jan. 16, 2006, and No. 2006-209716 filed in Japan on Aug. 1, 2006, the entire contents of which are hereby incorporated by reference.

BACKGROUND OF THE INVENTION

The present invention relates to a semiconductor, an n-type semiconductor, a p-type semiconductor, a semiconductor junction device, a pn junction device and a photoelectric converter. The present invention relates, in particular, to a semiconductor junction device employing a p-type semiconductor and a photoelectric converter employing a p-type semiconductor.

Iron sulfide, which has a high optical absorption coefficient, is therefore expected to be applied to a light receiving and emitting device. If application is considered here, at least a conductive type control (pn control) technique is indispensable, and energetic researches and developments therefor are conducted. It is known that the reception and emission wavelengths of light are largely influenced by the forbidden bandwidth of the semiconductor. With regard to iron sulfide, the forbidden bandwidth is about 0.95 eV even in the case of $FeS_2$ single crystal that has the greatest forbidden bandwidth. In order to widen the application range, it is earnestly demanded to develop the forbidden bandwidth control (particularly forbidden bandwidth widening) technique.

As iron sulfide, the compositions of FeS, $FeS_2$ and $Fe_2S_3$ are known. The iron valence of FeS and $FeS_2$ is bivalent, whereas the iron valence of $Fe_2S_3$ is trivalent. In this case, $Fe_2S_3$, which is unstable and is decomposed into FeS and $FeS_2$ and easily decomposed into an iron oxide hydrate and sulfur in a wet air, is not suitable for application.

It is known that iron sulfide exhibits the p-type conductivity if sulfur is excessive or exhibits the n-type conductivity when sulfur is insufficient as compared with the stoichiometry when impurity doping is not performed.

On the other hand, energetic researches are conducted on the control of the conductive type by doping iron sulfide with an impurity.

For example, JP S61-106499 A discloses that, if a photoactive pyrite layer in which the stoichiometric deviation of a pyrite material conforms to a formula: $FeS_{2\pm X}$ [$0<x\leq0.05$], the impurity concentration has a value smaller than $10^{20}$ per 1 $cm^3$, a doping material of manganese (Mn), arsenic (As), cobalt (Co) or chlorine (Cl) is used, and the doping concentration of the doping material is about $10^{16}$ to $10^{19}$ per 1 $cm^3$ is applied to a solar cell, then the solar cell exhibits a satisfactory characteristic. There is a further disclosure that the n-type conductivity is obtained by doping pyrite $FeS_2$ with Ni or Co, and the p-type conductivity is obtained by doping pyrite $FeS_2$ with Cu or As.

Moreover, JP 2002-516651 A discloses that a semiconductor component in which a semiconductor substrate made of pyrite having at least partially a chemical composition $FeS_2$ is combined with at least one of boron (B) and phosphorus (P) or semiconductor components doped with the substances are most suitable and extremely efficient for use in applications for solar cells.

However, the techniques disclosed in JP S61-106499 A and JP 2002-516651 A have a problem that the conductive type control (pn control) is insufficient. For example, taking JP 2002-516651 A as an example, the technique described there mentions nothing about the matters necessary for practical use regarding which conductive type the dopants of boron (B) and phosphorus (P) become and so on, and this is still problematically a long way from practical use. Moreover, taking a full solid type solar cell that uses pyrite $FeS_2$ in the photoactive layer as an example, there is a problem that the photoelectric conversion efficiency comes to have a very low value of not greater than 1% in the full solid type solar cell as in the Schottky type diode structure and the like attributed to the fact that the conductive type control (pn control) is insufficient, as described in P. P. Altermatt, et al.; Solar Energy Materials & Solar Cells 71 (2002) p. 181 (Hereinafter, referred to "Altermatt, et al.").

Furthermore, JP S61-106499 A and JP 2002-516651 A mention nothing about a technique for controlling the forbidden bandwidth but the doping technique for conductive type control. Moreover, Altermatt, et al. and its cited documents have descriptions of the possibility of an increase in the forbidden bandwidth if $FeS_2$ is doped with zinc, but they do not show the ground therefor experimentally and theoretically, and no concrete practicable description exists in the above described document and its cited documents. Thus, it is the present condition that no established method is available as to the method for controlling the forbidden bandwidth of iron sulfide, and the method for controlling the forbidden bandwidth of iron sulfide is not known. Accordingly, it is demanded to clarify the method for controlling the forbidden bandwidth of iron sulfide.

SUMMARY OF THE INVENTION

An object of the present invention is to provide a semiconductor, an n-type semiconductor, a p-type semiconductor, a semiconductor junction device, a pn junction device and a photoelectric converter containing iron sulfide capable of performing conductive type control (pn control) and forbidden bandwidth control without any trouble and being usable as utility articles.

In order to achieve the object, the present invention provides a n-type semiconductor comprising iron sulfide and a group 13 element of the IUPAC system.

It is noted that the iron sulfide may have a crystal structure or a structure that is slightly shifted from the stoichiometry. Moreover, when the iron sulfide has a crystal structure, iron sulfide should preferably be bivalent particularly in terms of iron valence and should preferably be FeS or $FeS_2$.

When an n-type semiconductor is manufactured by incorporating a dopant into iron sulfide, the dopants that have been examined are Mn, Ni, Co and so on having the characteristics described in JP S61-106499 A, i.e., the substances that belong to the same transition metals as iron and are often contained as impurities in the natural pyrite ($FeS_2$). However, neither one of them has been able to obtain practical characteristics when used for a semiconductor junction device. This is presumably ascribed to the following facts. Although the n-conductive type results when the bivalent iron is replaced by a trivalent element, the transition metal elements that have been used basically tend to become bivalent though having the possibility of becoming trivalent and further taking plural valences other than them. Therefore, the activation rate of the dopant largely depends on the manufacturing method and so on, and the intended conductivity has not been easily obtained. The present inventor discovered that an iron sulfide having the n-conductive type of a good reproducibility could be obtained as the result of trial production of iron sulfide having the n-conductive type by using the group 13 element of the IUPAC system that had never been supposed as a dopant.

The n-type semiconductor of the present invention, which includes iron sulfide and the group 13 element of the IUPAC system, is therefore capable of satisfactorily controlling the conductive type to the n-type, remarkably improving the reproducibility and being used as a utility article.

In one embodiment of the n-type semiconductor, the group 13 element of the IUPAC system is at least one of Al, Ga and In.

The present inventor discovered that the generation of an impurity phase could be suppressed when at least one of Al, Ga and In was adopted as the group 13 element of the IUPAC system. Furthermore, it was discovered that the bandgap could be increased when the group 13 element of the IUPAC system contained Al. This is presumably ascribed to the fact that, because the ion radius of Al, Ga and In has a comparatively small difference to that of $Fe^{2+}$ among the group 13 element of the IUPAC system, the generation of the impurity phase can be suppressed when these elements are contained. Moreover, it is presumably ascribed to the fact that both ion radius and electronegativity of Al are smaller than those of $Fe^{2+}$.

In one embodiment of the n-type semiconductor, the group 13 element of the IUPAC system is contained by an amount of $5 \times 10^{15}$ cm$^{-3}$ to $5 \times 10^{21}$ cm$^{-3}$.

According to the embodiment, a quality iron sulfide semiconductor having satisfactory n-type conductivity can be manufactured.

In one embodiment of the n-type semiconductor, the iron sulfide contains $FeS_2$ of a pyrite type crystal structure.

According to the embodiment, a semiconductor characteristic suitable for application can be obtained.

A semiconductor junction device of the present invention comprises the n-type semiconductor of the present invention.

According to the present invention, since the n-type semiconductor of the present invention is included, the characteristics of the n-type semiconductor of the electronic conductivity and so on can be improved, and the device characteristics can be improved.

A pn junction device of the present invention comprises a pn junction constituted of the n-type semiconductor of the present invention and a p-type semiconductor containing iron sulfide.

According to the present invention, since the pn junction constituted of the n-type semiconductor of the present invention and the p-type semiconductor containing iron sulfide is provided, the rectification characteristic of the pn junction can be improved.

A photoelectric converter of the present invention comprises a pn junction constituted of the n-type semiconductor of the present invention and a p-type semiconductor containing iron sulfide.

According to the present invention, since the pn junction constituted of the n-type semiconductor of the present invention and the p-type semiconductor containing iron sulfide is provided, the photoelectric conversion efficiency can be remarkably improved.

According to the n-type semiconductor of the present invention, since iron sulfide and the group 13 element of the IUPAC system are included, the conductive type can be satisfactorily controlled, and the reproducibility can be remarkably improved, allowing the semiconductor to be used as a utility article.

A semiconductor of the present invention comprises:
iron sulfide; and
a forbidden band control element contained in the iron sulfide, wherein
the forbidden band control element has a property capable of controlling the forbidden band of the iron sulfide on the basis of a number density of the forbidden band control element in the iron sulfide.

According to the present invention, since the forbidden band control element has the property capable of controlling the forbidden band of the iron sulfide on the basis of the number density of the forbidden band control element in the iron sulfide, the forbidden band of iron sulfide can be controlled to the prescribed value by controlling the number density of the forbidden band control element contained in iron sulfide.

In one embodiment of the semiconductor, the forbidden band control element is Mg.

The present inventor attempted the forbidden bandwidth control of iron sulfide with Mg contained. As a result, it was discovered that iron sulfide having the desired forbidden band within the wide forbidden bandwidth could be produced.

According to the embodiment, since iron sulfide and Mg are contained, the forbidden bandwidth can be satisfactorily controlled. It is noted that the iron sulfide may have a crystal structure or a structure slightly shifted from the stoichiometry. Moreover, when the iron sulfide has the crystal structure, iron sulfide should preferably be bivalent particularly in terms of iron valence and should preferably be FeS or $FeS_2$.

In one embodiment of the semiconductor, assuming that an amount of Fe atoms is "a" and an amount of Mg atoms is "b", then an expression: $0.001 \leq b/a \leq 0.45$ holds.

According to the embodiment, since $0.001 \leq b/a \leq 0.45$ when the amount of Fe atoms is assumed as "a" and the number of Mg atoms is assumed as "b", the control of the forbidden bandwidth can accurately be performed.

In one embodiment of the semiconductor, the iron sulfide contains $FeS_2$ of a pyrite type crystal structure.

According to the embodiment, a large forbidden bandwidth can be obtained.

One embodiment of the semiconductor comprises a group Ia element.

According to the embodiment, the p-type conductivity can be given.

In one embodiment of the semiconductor, the group Ia element is Na.

According to the embodiment, the hole carrier density can particularly be increased.

One embodiment of the semiconductor comprises a group III element.

According to the embodiment, the n-type conductivity can be given.

In one embodiment of the semiconductor, the group III element is Al.

According to the embodiment, the electron carrier density can particularly be increased.

In another aspect, a semiconductor junction device of the present invention comprises the semiconductor of the present invention.

According to the present invention, since the semiconductor of the present invention capable of controlling the forbidden band is included, the device characteristics can be properly controlled in accordance with the application purpose.

In another aspect, a pn junction device of the present invention comprises a pn junction comprising the semiconductor of the present invention.

According to the present invention, since the pn junction including the semiconductor of the present invention is provided, the forbidden bandwidth can be controlled in accordance with the application purpose, and the rectification characteristic can be improved.

One embodiment of the pn junction device comprises a pn junction constituted of a p-type semiconductor containing iron sulfide and Mg and an n-type semiconductor, and, assuming that the forbidden bandwidth of the p-type semiconductor is Eg1 and the forbidden bandwidth of the n-type semiconductor is Eg2, then an expression: Eg1<Eg2 holds.

According to the embodiment, when the pn junction device is, for example, a photoelectric converter, the photoelectric conversion efficiency can be increased.

In one embodiment of the pn junction device, the n-type semiconductor contains Mg.

According to the embodiment, the concentration gradient can be controlled by arbitrarily adjusting the heat treatment condition.

In another aspect, a photoelectric converter of the present invention comprises the semiconductor junction device of the present invention or the pn junction device of the present invention.

According to the present invention, when the semiconductor junction device of the present invention is provided, the forbidden bandwidth can be controlled to a value appropriate for the purpose, and the device characteristics can be improved. Moreover, since the forbidden bandwidth is controlled to a value appropriate for the objective light wavelength when the pn junction including the semiconductor of the present invention is provided, the photoelectric conversion efficiency can be remarkably improved.

In one embodiment of the semiconductor, the forbidden band control element is Zn.

The present inventor attempted the forbidden bandwidth control of iron sulfide with Zn contained. As a result, it is discovered that iron sulfide having the desired forbidden band within a wide forbidden bandwidth could be produced.

According to the embodiment, since iron sulfide and Zn are contained, an iron sulfide semiconductor whose forbidden band is controlled to the desired value can be manufactured. It is noted that the iron sulfide may have a crystal structure or a structure slightly shifted from the stoichiometry. Moreover, when the iron sulfide has the crystal structure, iron sulfide should preferably be bivalent particularly in terms of iron valence and should preferably be FeS or $FeS_2$.

In one embodiment of the semiconductor, assuming that an amount of Fe atoms is "a" and an amount of Zn atoms is "b", then an expression: $0.001 \leq b/a \leq 0.45$ holds.

According to the embodiment, since $0.01 \leq b/a \leq 0.45$ when the amount of Fe atoms is assumed as "a" and the amount of Zn atoms is assumed as "b", the control of the forbidden bandwidth can accurately be performed.

In one embodiment of the semiconductor, the iron sulfide contains $FeS_2$ of a pyrite type crystal structure.

According to the embodiment, a large forbidden bandwidth can be obtained.

One embodiment of the semiconductor comprises a group Ia element.

According to the embodiment, the p-type conductivity can be given.

In one embodiment of the semiconductor, the group Ia element is Na.

According to the embodiment, the hole carrier density can particularly be increased.

One embodiment of the semiconductor comprises a group III element.

According to the embodiment, the n-type conductivity can be given.

In one embodiment of the semiconductor, the group III element is Al.

According to the embodiment, the electron carrier density can particularly be increased.

In another aspect, a semiconductor junction device of the present invention comprises the semiconductor of the present invention.

According to the present invention, since the semiconductor of the present invention capable of controlling the forbidden band is included, the device characteristics can be properly controlled in accordance with the application purpose.

In another aspect, a pn junction device of the present invention comprises a pn junction comprising the semiconductor of the present invention.

According to the present invention, since the pn junction including the semiconductor of the present invention is provided, the forbidden bandwidth can be controlled in accordance with the application purpose, and the rectification characteristic can be improved.

One embodiment of the pn junction device comprises a pn junction constituted of a p-type semiconductor containing iron sulfide and Zn and an n-type semiconductor, and, assuming that the forbidden bandwidth of the p-type semiconductor is Eg1 and the forbidden bandwidth of the n-type semiconductor is Eg2, then an expression: Eg1<Eg2 holds.

According to the embodiment, when the pn junction device is, for example, a photoelectric converter, the photoelectric conversion efficiency can be increased.

In one embodiment of the pn junction device, the n-type semiconductor contains Zn.

According to the embodiment, a satisfactory rectification characteristic can be obtained between the n-type semiconductor layer and the p-type semiconductor layer constituted with iron sulfide to which Zn is added.

In one embodiment of the pn junction device, the n-type semiconductor contains an oxide of Zn.

According to the embodiment, it is allowed to increase the forbidden bandwidth and increase the electrical resistance.

In another aspect, a photoelectric converter of the present invention comprises the semiconductor junction device of the present invention or a pn junction device of the present invention.

According to the present invention, when the semiconductor junction device of the present invention is provided, the forbidden bandwidth can be controlled to a value appropriate for the purpose, and the device characteristics can be improved. Moreover, since the forbidden bandwidth is controlled to the value appropriate for the objective light wavelength when the pn junction including the semiconductor of the present invention is provided, the photoelectric conversion efficiency can be remarkably improved.

One embodiment of the semiconductor comprises a group Ia element.

According to the embodiment, the p-type conductivity can be given.

A p-type semiconductor of the present invention comprises iron sulfide and a group Ia element.

It is reported that almost all the artificially produced iron sulfides that have been examined exhibit the p-type conductivity. Therefore, it is often the case where undoped iron sulfide is used as the p-type iron sulfide. However, atomic deficiency also has the possibility of exerting a bad electrical influence of recombination center and so on concurrently with a doping capability. The inventor attempted producing of a p-type iron sulfide by impurity doping using the group Ia element that had never been supposed. As a result, it was discovered that an iron sulfide having a quality p-conductive type could be produced.

According to the present invention, since iron sulfide and the group Ia element are contained, the conductive type can satisfactorily be controlled to the p-type, and the defect density can be reduced. It is noted that the iron sulfide may have a crystal structure or a structure slightly shifted from the stoichiometry. Moreover, when the iron sulfide has a crystal structure, iron sulfide should preferably be bivalent particularly in terms of iron valence and should preferably be FeS or $FeS_2$.

In one embodiment of the p-type semiconductor, the group Ia element is at least one of Li, Na and K.

The present inventor discovered that the generation of the impurity phase could be suppressed when at least one of Li, Na and K was adopted as the group Ia element. This is presumably ascribed to the fact that the ion radius of Li, Na and K has a comparatively small difference in that of $Fe^{2+}$ among the group Ia elements.

According to the embodiment, the generation of the impurity phase can be suppressed.

In one embodiment of the p-type semiconductor, the group Ia element is Na, and a number density of Na is not smaller than $4 \times 10^{15}$ cm$^{-3}$ and not greater than $2 \times 10^{20}$ cm$^{-3}$.

According to the embodiment, the conductivity can be made satisfactory p-type conductivity, and the quality can be made excellent.

In one embodiment of the p-type semiconductor, the iron sulfide contains $FeS_2$ of a pyrite type crystal structure.

According to the embodiment, semiconductor characteristics suitable for application can be obtained.

In another aspect, a semiconductor junction device of the present invention comprises the p-type semiconductor of the present invention.

According to the present invention, since the p-type semiconductor of the present invention is included, the characteristics of carrier transport characteristic and so on of the p-type semiconductor can be improved, and the device characteristics can be improved.

In another aspect, a pn junction device of the present invention comprises a pn junction constituted of the p-type semiconductor of the present invention and a n-type semiconductor containing iron sulfide.

According to the present invention, since the pn junction constituted of the p-type semiconductor of the present invention and the n-type semiconductor containing iron sulfide is provided, the rectification characteristic of the pn junction can be improved.

In one embodiment of the pn junction device, the n-type semiconductor contains at least one of Co, Ni and Mn.

In one embodiment of the pn junction device, the n-type semiconductor contains at least one of Al, Ga and In.

In one embodiment of the pn junction device, the n-type semiconductor contains $FeS_2$ of a pyrite type crystal structure.

A $p^+$-p-n junction device of the present invention comprises:
the pn junction device of the present invention; and
a $p^+$-type semiconductor layer having a number density of a group Ia element higher than the number density of the group Ia element in the p-type semiconductor of the pn junction device.

In one embodiment of the $p^+$-p-n junction device, the number density of the group Ia element in the $p^+$-type semiconductor layer is not smaller than 20 times the number density of the group Ia element in the p-type semiconductor.

In another aspect, a photoelectric converter of the present invention comprises at least one of the semiconductor junction device of the present invention, the pn junction device of the present invention and the $p^+$-p-n junction device of the present invention.

According to the present invention, the photoelectric conversion efficiency can be remarkably improved.

According to the semiconductor, the p-type semiconductor, the semiconductor junction device and the pn junction device of the present invention, the forbidden bandwidth control can be performed without trouble, and the conductive type control (pn control) can be performed without trouble, allowing them to be used as utility articles. Moreover, according to the p-type semiconductor of the present invention, the conductive type can be made the p-type with good reproducibility, and the defect density can be reduced. This makes it possible to use them as utility articles. Moreover, according to the photoelectric converter of the present invention, the photoelectric conversion efficiency can be made excellent.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a table showing the kinds and concentrations of the compounds used for manufacturing the sulfide semiconductors of the examples 1 through 7 of the present invention and comparative example 1;

FIG. 5 is a table showing a spray solution for the p-type and a spray solution for the n-type used in forming the photoelectric converter shown in FIG. 4;

FIG. 9 is a table showing the kinds and concentrations of the compounds used for manufacturing the sulfide semiconductors of the examples 101 through 106 of the present invention and comparative example 101;

FIG. 10 is a table showing the kinds and concentrations of the compounds used for manufacturing the sulfide semiconductors of the examples 107 and 108 of the present invention and comparative example 101;

FIG. 11 is a table showing the kinds and photoelectric conversion efficiencies of the n-type semiconductor layers owned by the photoelectric converters of the examples 109 through 112 of the present invention;

FIG. 15 is a table showing the kinds and concentrations of the compounds used for manufacturing the sulfide semiconductors of the examples 113 through 118 of the present invention and comparative example 102;

FIG. 16 is a table showing the kinds and concentrations of the compounds used for manufacturing the sulfide semiconductors of the examples 119 through 120 of the present invention and comparative example 102;

FIG. 17 is a table showing the kinds and photoelectric conversion efficiencies of the n-type semiconductor layers owned by the photoelectric converters of the examples 121 through 124 of the present invention;

FIG. 20 is a table showing the kinds and concentrations of the compounds used for manufacturing the sulfide semiconductors of the examples 125 through 132 of the present invention and comparative example 103;

FIG. 22 is a table showing the kinds of spray solutions used for manufacturing the photoelectric converters of the examples 133 through 144 of the present invention;

FIG. 24 is a table showing the kinds of spray solutions used for manufacturing the photoelectric converters of the examples 145 through 150 of the present invention;

DETAILED DESCRIPTION OF THE INVENTION

Figure 1:
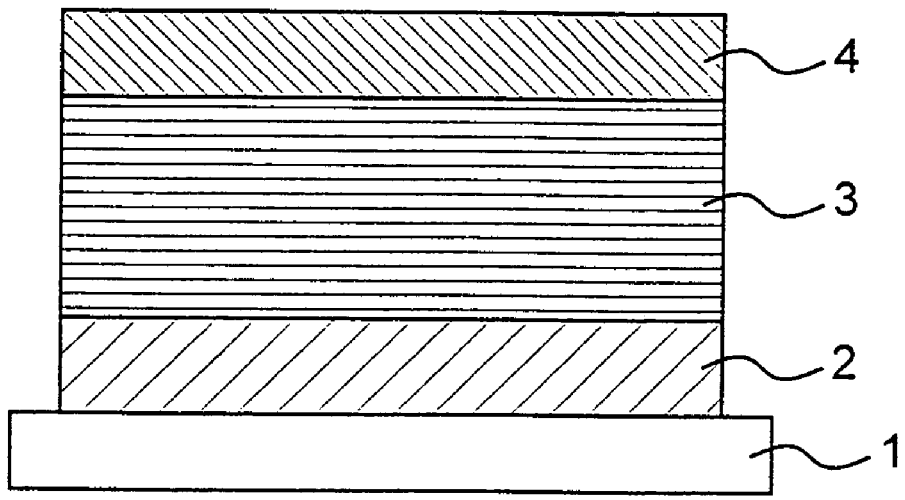
FIG. 1 is a sectional view of the photoelectric converter of one embodiment of the present invention.

The present invention will be described in detail below by the embodiments shown in the drawings.

FIG. 1 is a sectional view of the photoelectric converter of one embodiment of the present invention.

The photoelectric converter has a substrate 1, a first electrode layer 2 formed on a surface region of at least part of the substrate 1, a photoelectric conversion layer 3 formed on the first electrode layer 2, and a second electrode layer 4 formed on the photoelectric conversion layer 3.

It makes no matter whether or not the substrate 1 has translucency when the substrate 1 is located on the side opposite from the light incidence side, while at least part of the substrate 1 should preferably have translucency when the substrate 1 is located on the light incidence side. As a material of the translucent substrate, there can be used glass, translucent resins of a polyimide system, a polyvinyl system or a polysulfide system having a heat resistance, a laminate of the materials and so on. As a material of a non-translucent substrate, there can be used stainless steel, non-translucent resins and so on. Undulations may be formed on the surface of the substrate 1, and in this case, various effects of optical confinement, antireflection and so on can be obtained by the refraction, scattering and so on of light on the undulated surface. Moreover, it is acceptable to provide a coating of a metal film, a semiconductor film, an insulator, a composite film of the materials or the like on the surface of the substrate 1. The thickness of the substrate 1 is not specifically limited but required to have appropriate strength and weight capable of supporting the structure, and a thickness of 0.1 mm to 40 mm can be adopted as the thickness of the substrate 1.

The form of the first electrode layer 2 is not specifically limited so long as it is substantially put in ohmic contact with the photoelectric conversion layer 3, but the layer should preferably be formed in a film shape on the substrate 1. The material used for the first electrode layer 2 is not specifically limited so long as it has conductivity. Preferably, it is allowed to use an opaque material of Mo, Al, Pt, C, Ti, Fe, Pd or the like, an alloy of the material or a transparent conductive oxide electrode material represented by fluorine-doped tin oxide ($SnO_2$:F), antimony-doped tin oxide ($SnO_2$:Sb), tin-doped indium oxide ($In_2O_3$:Sn), Al-doped zinc oxide (ZnO:Al), Ga-doped zinc oxide (ZnO:Ga), B-doped zinc oxide (ZnO:B) and the like. Moreover, the first electrode layer 2 may be a monolayer film of any of the materials described above or a laminate film in which a plurality of layers of the materials are layered.

When the first electrode layer 2 is located on the light incidence side, the first electrode layer 2 should preferably have a high translucency in an optical wavelength region that contributes to photoelectric conversion. The first electrode layer 2 is formed on the substrate 1 by a gas phase method such as vacuum evaporation method, sputtering method, CVD method and PVD method, sol-gel method, CBD (chemical bus deposition) method, spraying method, screen printing method and the like using the component that becomes the material.

As described above, when the substrate 1 is located on the light incidence side, the first electrode layer 2 is required to have a high optical translucency. Therefore, the first electrode layer 2 should preferably be formed of a metal electrode having a grid shape such as a comb-like shape of which the surface is not uniformly covered, a transparent conductive layer of a high optical translucency or by combining those requirements.

The first electrode layer 2 should preferably have undulations on the surface thereof. The undulations existing on the surface of the first electrode layer 2 refract and scatter light that has entered the inside of the photoelectric converter at an interface located between the first electrode layer 2 and the photoelectric conversion layer 3 formed on it. As a result, the optical path length of the incident light becomes long to improve the light confining effect, and the quantity of light that can be utilized in the photoelectric conversion layer 3 is to be increased. As a method for forming the undulations, a dry etching method, a wet etching method, mechanical processing like sand blasting or the like on the surface of the first electrode layer 2 can be used.

As the dry etching method, chemical etching using a fluorine based gas such as $CF_4$ or $SF_6$, a chlorine based gas such as $CCl_4$ or $SiCl_4$, methane gas or the like besides physical etching using an inert gas such as Ar can be used. As the wet etching method, a method for immersing the first electrode layer 2 in an acid or alkaline solution or the like can be used. In this case, mixtures of one kind or two or more kinds of hydrochloric acid, sulfuric acid, nitric acid, hydrofluoric acid, acetic acid, formic acid and perchloric acid can be enumerated as usable acid solutions. Mixtures of one kind or two or more kinds of sodium hydroxide, ammonia, potassium hydroxide, calcium hydroxide and aluminum hydroxide can be enumerated as alkaline solutions. As methods other than the etching method described above, there are a method for using the surface undulations self-formed by the crystal growth of the material itself of the first electrode layer 2 by the CVD method or the like and a method for using the surface undulations depending on the crystal grain shape by the sol-gel method or the spraying method.

The photoelectric conversion layer 3 is formed on the first electrode layer 2 substantially in mutual ohmic contact. The photoelectric conversion layer 3 is formed by adding a group 13 element of the IUPAC system to iron sulfide. The photoelectric conversion layer 3 has a structure including a semiconductor layer whose conductive type is controlled to the n-type. The structure of the photoelectric conversion layer 3 is provided by a structure that includes a pn junction having a p-type semiconductor layer and an n-type semiconductor layer, a structure that includes a pin junction having a p-type semiconductor layer, an intrinsic (i-type) semiconductor layer and an n-type semiconductor layer, a Schottky junction having only an n-type semiconductor layer, a structure that includes a semiconductor junction such as a MIS structure or the like. It is noted that the i-type semiconductor layer may exhibit a weak p-type or weak n-type conductive type so long as the photoelectric conversion function is not impaired. Moreover, the photoelectric converter may have a structure in which two or more photoelectric conversion layers are layered, and the photoelectric converter may be a so-called laminate type photoelectric converter.

When a group 13 element of the IUPAC system is added to iron sulfide, a quality n-conductive type semiconductor layer excellent in reproducibility can be obtained. This is presumably ascribed to the fact that the group 13 element of the IUPAC system exists in the crystal lattice of iron sulfide because any impurity crystal phase other than the diffraction pattern of iron sulfide has not been observed as the result of an X-ray diffraction measurement and a peak shift has been observed in the diffraction pattern of iron sulfide.

For example, when a trivalent group 13 element of the IUPAC system is substituted into a bivalent iron site, the group 13 element of the IUPAC system element becomes a donor, and an n-conductive type semiconductor layer is formed. In this case, the group 13 element of the IUPAC system should preferably be contained within a range of $5 \times 10^{15}$ $cm^{-3}$ to $5 \times 10^{21}$ $cm^{-3}$ in the iron sulfide. Whether or not the element can be formed into the n-type depends on the carrier density of iron sulfide before doping. The greater part of iron sulfide before doping was the p-type, and the hole carrier density was $3 \times 10^{15}$ $cm^{-3}$ to $3 \times 10^{21}$ $cm^{-3}$. In this case, it is necessary and indispensable to make the element contain an effective donor of a density higher than the hole carrier density of iron sulfide before doping for the formation of the n-type. Actually, a slightly excessive doping is necessary since the doped group 13 (group 13 element of the IUPAC system) atoms do not all became a donor. According to experiments, a quality iron sulfide semiconductor having a particularly satisfactory n-type conductivity was able to be obtained when the group 13 element of the IUPAC system element had a density of not smaller than $5 \times 10^{15}$ $cm^{-3}$.

On the other hand, when the group 13 element of the IUPAC system concentration in iron sulfide was increased, the electron carrier density was gradually increased and thereafter exhibited a tendency of saturation as described later. When the group 13 element of the IUPAC system concentration exceeded a definite value, the electrical characteristic was not largely changed though it was further increased. As a result, an iron sulfide semiconductor of a particularly good quality having the n-type conductivity was able to be obtained when iron atoms and IIIb group atoms had a concentration of not greater than $5 \times 10^{21}$ $cm^{-3}$. It is noted that the kind and concentration of the group 13 element of the IUPAC system element in iron sulfide can be evaluated by the element analysis method of secondary ion mass spectrometry (SIMS) and Auger electron spectroscopy or the like.

Moreover, as described below, when an element selected from Al, Ga and In, whose ion radius has a comparatively small difference to that of $Fe^{2+}$, among the group 13 element of the IUPAC system is contained, the generation of the impurity crystal phase can be suppressed, and this is preferable. Particularly, when Al is contained as a group 13 element of the IUPAC system, the ion radius and the electronegativity are both smaller than those of $Fe^{2+}$, and the bandgap can be increased.

Moreover, it was ascertained that a semiconductor characteristic suitable for application could be obtained when iron sulfide contained $FeS_2$ of a pyrite type crystal structure. The pyrite type $FeS_2$ is useful as a material for a solar cell since it has a high optical absorption coefficient (up to $10^5$ $cm^{-1}$) with respect to the visible light and as a material used for a light receiving and emitting device for optical communications since it has a bandgap close to the wavelength of up to 1.55 µm (photon energy of up to 0.85 eV) of the lowest loss of optical fibers. Therefore, the characteristics of iron sulfide can be brought close to characteristics useful for the use described above when $FeS_2$ having the pyrite type crystal structure is contained, and this is preferable.

Moreover, in a case where iron sulfide contains a great amount of $FeS_2$ having the pyrite type crystal structure, a comparatively high carrier mobility (up to 100 $cm^2/Vs$) can be achieved even in the case of a polycrystal. Therefore, when it is used as a material for an inexpensive transistor, the semiconductor characteristics can be remarkably improved.

As a method for manufacturing the photoelectric conversion layer 3, manufacturing methods such as MBE method, CVD method, vapor deposition method, close-spaced sublimation method, sputtering method, sol-gel method, spraying method, CBD (chemical bus deposition) method, screen printing method and the like can be used. For example, atmospheric pressure CVD, low-pressure CVD, plasma CVD, thermal CVD, hot-wire CVD, MOCVD and the like can be enumerated as the CVD method. In forming the photoelectric conversion layer 3, a sulfide treatment in a sulfur vapor or in a hydrogen sulfide atmosphere can be carried out at need. A sulfide treatment temperature should preferably be 200 to 600° C. If the sulfide treatment is carried out, it is allowed to promote the crystallization of an amorphous component, increase the sulfur percentage content in iron sulfide and increase the ratio of $FeS_2$ having the pyrite type crystal structure. In this case, the ratio of the amorphous component can be estimated by carrying out an XRD measurement and comparing the peak intensity with peak intensity in a case where sufficient crystallization is achieved with the film thickness made same. Moreover, the ratio of $FeS_2$ having the pyrite type crystal structure can be estimated by comparing the XRD peak intensity of the pyrite structure with the XRD peak intensity of the other structures.

The second electrode layer 4 is formed on the photoelectric conversion layer 3 substantially in mutual ohmic contact. The material and the manufacturing method used for the second electrode layer 4 are similar to those in the formation of the first electrode layer 2. A photoelectric converter of high photoelectric conversion efficiency is thus formed.

Figure 2:
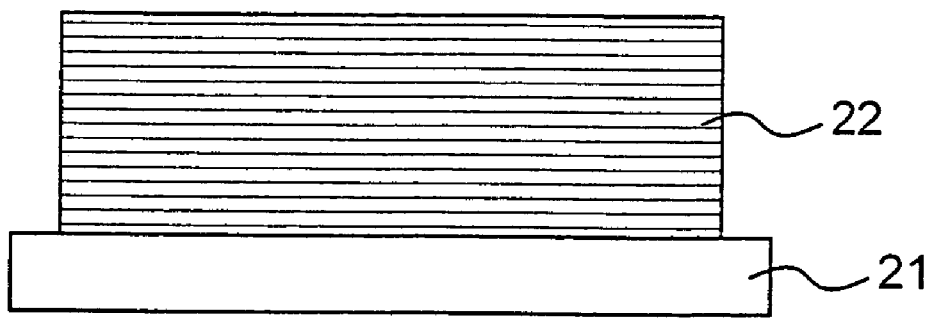
FIG. 2 is a schematic sectional view of the sulfide semiconductors of the examples 1 through 7 of the present invention and comparative example 1.

FIG. 2 is a schematic sectional view of the sulfide semiconductor of the examples 1 through 7 and comparative example 1 of the present invention, and FIG. 3 is a table showing the kinds and concentrations of the compounds used for manufacturing the sulfide semiconductors of the examples 1 through 7 of the present invention and the comparative example 1. An n-type semiconductor layer of the examples 1 through 7 is described below on the basis of FIGS. 2 and 3. The iron sulfide semiconductor of the examples 1 through 7 is manufactured by forming an iron sulfide layer 22 on a glass substrate 21 having a thickness of 1.1 mm by using the spray pyrolysis method and the sulfurization method together.

In detail, for example, a solution having 0.05 mol/l of iron chloride ($FeCl_2$) and 0.1 mol/l of thiourea ($NH_2CSNH_2$) is produced by incorporating iron chloride ($FeCl_2$) and thiourea ($NH_2CSNH_2$) into 500 ml of pure water.

Next, solutions for spraying are formed by further dissolving compounds containing the doping elements of which the kinds and concentrations of the compounds are shown in FIG. 3 in the produced solution. In this case, when the solute is not easily dissolved, hydrochloric acid is added. By so doing, the solute can be easily dissolved. Hydrochloric acid was not added in the examples 1 through 5 and 7 and the comparative example 1, while hydroxide gallium ($Ga_2O_3 \cdot nH_2O$) was dissolved by adding 3 ml of 35% hydrochloric acid in the case of the example 6.

Next, the glass substrate 21 is heated to a temperature of about 300° C. on a hot plate in the atmosphere, and thereafter, thin films are formed by spray coating of the solutions of which the details are shown in FIG. 3 on the hot plate. As the result of subjecting the thin films formed by spray coating to an XRD measurement, the peaks of oxide and hydroxide of iron were not observed. From this fact, it was confirmed that the principal ingredient of the thin films was FeS.

Next, the processed resultants are baked at a temperature of 500° C. for one hour in a sulfur vapor atmosphere. At this time, a sulfur vapor is generated by heating sulfur at a temperature of lower than 200° C. by means of a heater other than the heater for heating the samples, and a nitrogen gas is flowed as a carrier gas at a rate of 5 l/min. As the result of carrying out an XRD measurement after the sulfide treatment, it was confirmed that the single phase of $FeS_2$ pyrite was formed. Moreover, as the result of measuring the thickness of the iron sulfide layer 22 by means of a level-difference thickness meter, the thickness was 700 nm. The iron sulfide semiconductor shown in FIG. 2 was thus manufactured.

In FIG. 3, the conductive type and the carrier density are the results of Hall measurement. Moreover, in FIG. 3, the group 13 element of the IUPAC system concentrations are the results of SIMS measurement in the examples 1 and 2 and the results of Auger electron spectroscopy measurement in the examples 3 through 7. Moreover, in FIG. 3, Eg (eV) is the result of optical bandgap (Eg) measurement. In this case, regarding Eg, the second power of the optical absorption coefficient is plotted with respect to the energy of the incident light, and a direct transition bandgap is obtained from its X segment.

As shown in FIG. 3, the conductive type was the p-type in the comparative example 1 that has not undergone doping, while the conductive type was the n-type in the examples 1 through 7 that has undergone doping. From this fact, an n-type iron sulfide semiconductor can be formed when iron sulfide contains a group 13 element of the IUPAC system concentration.

Moreover, the examples 3, 6 and 7 have an equal group 13 element of the IUPAC system concentration but differ in the kind of the group 13 element of the IUPAC system. If the examples 3, 6 and 7 are compared with one another, roughly equivalent values are obtained with regard to the electron carrier density, while Eg is larger than in the comparative example 1 only in the example 3. From this fact, a wider bandgap can be provided concurrently with the formation of the n-type when the dopant contains an Al element.

Moreover, the examples 1 through 5 are equal in the kind of group 13 element of the IUPAC system but differ in the concentration of the group 13 element of the IUPAC system. If the examples 1 through 5 are compared with one another, the electron carrier density increases as the Al concentration increase up to an Al concentration of $2 \times 10^{21}$ cm$^{-3}$, while the electron carrier density does not increase exhibiting a definite value and the electron carrier density is saturated even if the Al concentration increases when the Al concentration exceeds $2 \times 10^{21}$ cm$^{-3}$.

On the other hand, it is necessary and indispensable for the lowest doping rate as to whether or not the n-type can be formed to be not smaller than the hole carrier density of iron sulfide before doping as described above. Therefore, if the concentration of the group 13 element of the IUPAC system contained in iron sulfide is set within a range of $5 \times 10^{15}$ cm$^{-3}$ to $5 \times 10^{21}$ cm$^{-3}$, the conductive type of the iron sulfide semiconductor can be made the n-type, and excess electrons can be efficiently generated by the doping of the group 13 element of the IUPAC system at the same time, allowing a carrier density corresponding to the doping rate of the group 13 element of the IUPAC system to be achieved. If a semiconductor junction device of a diode, a transistor, a semiconductor laser device or the like is formed by employing the n-type semiconductor of the present invention, the characteristics of the electronic conductivity and so on of the n-type semiconductor of the semiconductor junction device can be improved. Therefore, the device characteristics of the semiconductor junction device can be remarkably improved.

Figure 4:
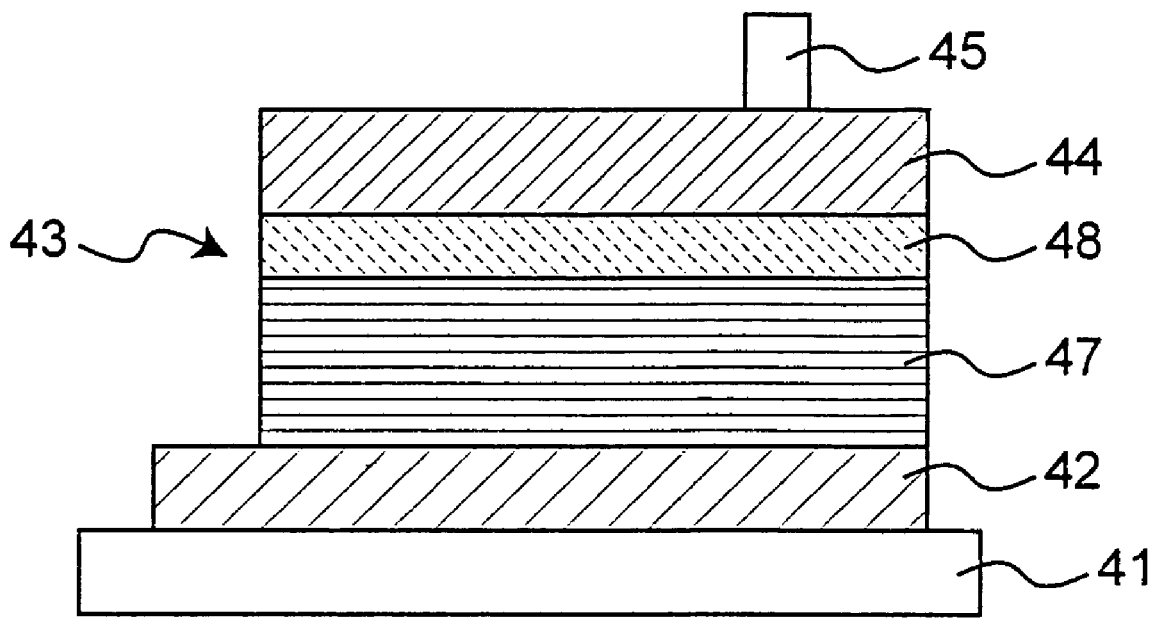
FIG. 4 is a sectional view of the photoelectric converter of the examples 8 through 14 of the present invention.

FIG. 4 is a sectional view of the photoelectric converter of the examples 8 through 14 of the present invention.

The photoelectric converter of the examples 8 through 14 is formed as follows. First of all, an electrode layer 42 is formed by forming a Pt film having a thickness of 500 nm on a glass substrate 41 that has a film thickness of, for example, 1.1 mm by the vacuum evaporation method. Next, by using the spray pyrolysis method and the sulfurization method together on the electrode layer 42, a photoelectric conversion layer 43 that has a pn junction of $FeS_2$ pyrite is formed. Subsequently, a transparent conductive film 44 is formed on the photoelectric conversion layer 43, and thereafter, a grid electrode 45 is formed on the transparent conductive film 44, forming a photoelectric converter.

In detail, the same spray solution for the p-type as that of the comparative example 1 of FIG. 3 is used in forming the p-type $FeS_2$ pyrite. The glass substrate 41, on which the first electrode layer 42 is layered, is heated to a temperature of about 300° C. on a hot plate in the atmosphere, and a thin film is formed by spray coating of the solution on it. As the result of subjecting the spray coated thin film to an XRD measurement, the peaks of oxide and hydroxide of iron were not observed, and it was confirmed that the thin film was FeS.

Next, the processed resultant is baked at a temperature of 500° C. for one hour in a sulfur vapor atmosphere. At this time, a sulfur vapor is generated by heating sulfur at a temperature of lower than 200° C. by means of a heater other than the heater for heating the samples, and a nitrogen gas is flowed as a carrier gas at a rate of 5 l/min. As the result of carrying out an XRD measurement after the sulfide treatment, it was confirmed that the single phase of $FeS_2$ pyrite was formed. Moreover, the thickness was 2 μm.

Subsequently, spray coating is carried out again to produce n-type $FeS_2$ pyrite on p-type $FeS_2$ pyrite. FIG. 5 is a table showing spray solutions for the p-type and spray solutions for the n-type used in producing n-type $FeS_2$ pyrite on p-type $FeS_2$ pyrite. In the examples 8 through 14, the spray solutions shown in FIG. 5 were used diluted twentyfold with pure water.

The substrate, on which the p-type $FeS_2$ pyrite has been formed, is heated to a temperature of about 80° C. on the hot plate in the atmosphere and coated with the solution by spray coating, forming a thin film. At this time, the frequency of spraying is adjusted so that the film thickness becomes 50 nm, and thereafter, the processed resultant is baked at a temperature of 500° C. in a sulfur vapor atmosphere as in the case of the p-type. In this case, the baking time was set to ten minutes. The photoelectric conversion layer 43 constituted of a p-type semiconductor layer 47 formed on the electrode layer 42 and an n-type semiconductor layer 48 formed on the p-type semiconductor layer 47 is thus formed.

Subsequently, the transparent conductive film 44 is formed by depositing n-type gallium-doped zinc oxide (ZnO:Ga) to a thickness of 700 nm on the photoelectric conversion layer 43 by the magnetron sputtering method, and thereafter, the grid electrode 45 is formed by forming a comb-like shape of silver (Ag) on the transparent conductive film 44 by the magnetron sputtering method. The photoelectric converter shown in FIG. 4 is thus formed.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion efficiencies were measured under the conditions of a cell temperature of 25° C. and a cell area of 1 cm$^2$. The photoelectric conversion efficiencies in FIG. 5 are the measurement results.

As shown in FIG. 5, all the photoelectric converters of the examples 8 through 14 exhibited rectification properties, and the conversion efficiency of each photoelectric converter had a high value exceeding 2%. From this fact, a satisfactory pn junction can be constituted by using the iron sulfide semiconductor of the present invention as an n-type semiconductor. Moreover, because the photoelectric conversion efficiencies of the examples 13 and 14 that contain no Al element as a dopant of the n-type semiconductor is smaller than the photoelectric conversion efficiency of the example 10 that contains an Al element as a dopant of the n-type semiconductor, the photoelectric conversion efficiency can be improved when a material containing an Al element as a dopant of the n-type semiconductor is adopted.

The reason why the highest conversion efficiency can be obtained when Al is contained is presumed to be as follows. That is, since the n-type layer exists on the light incidence side in the present example, a loss of light occurs in the n-type layer. In this case, since light having an energy being not higher than the bandgap is transmitted when the bandgap of the n-type layer is large, an optical loss reduction effect in the n-type layer can be improved. An increase in the short-circuit current density as a consequence of this is considered to be the reason for the high conversion efficiency when Al is contained.

Although the photoelectric converter was manufactured by employing the pn junction constituted of the n-type semiconductor of the present invention and the p-type semiconductor containing iron sulfide in the examples 8 through 14, it is, of course, acceptable to manufacture pn junction devices such as diodes, transistors (pnp transistor, npn transistor and pnip transistor) and switches (pnpm switch and pnpn switch) having a pn junction by employing the pn junction constituted of the n-type semiconductor of the present invention and the p-type semiconductor containing iron sulfide. If a pn junction device is manufactured by employing the pn junction constituted of the n-type semiconductor of the present invention and the p-type semiconductor containing iron sulfide, the rectification characteristic of the pn junction device can be remarkably improved, and the device characteristics of the pn junction device can be remarkably improved.

Figure 6:
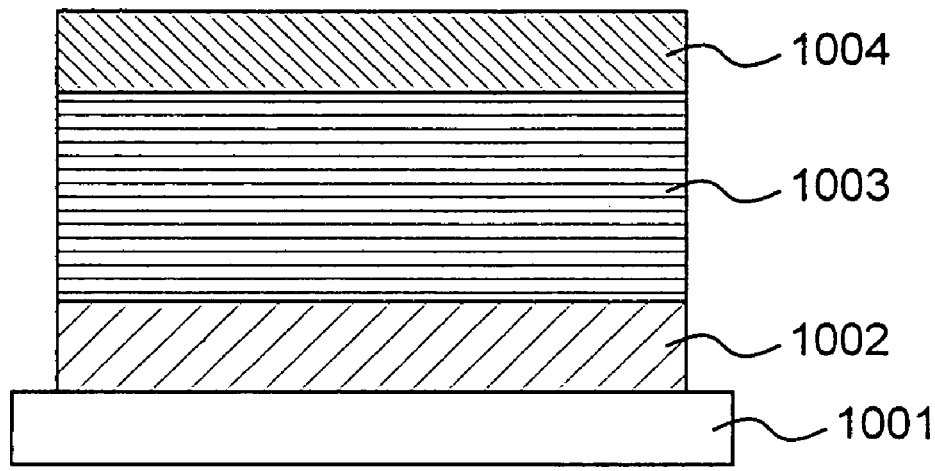
FIG. 6 is a schematic sectional view of the photoelectric converter of one embodiment of the present invention.

FIG. 6 is a sectional view of the photoelectric converter of one embodiment of the present invention.

The photoelectric converter has a substrate 1001, a first electrode layer 1002 formed in a surface region of at least part of the substrate 1001, a photoelectric conversion layer 1003 formed on the first electrode layer 1002 and a second electrode layer 1004 formed on the photoelectric conversion layer 1003.

It makes no matter whether or not the substrate 1001 has translucency when the substrate 1001 is located on the side opposite from the light incidence side, while at least part of the substrate 1001 should preferably have translucency when the substrate 1001 is located on the light incidence side. As a material of the translucent substrate, there are glass and translucent resins having a certain heat resistance among the polyimide system, the polyvinyl system and the polysulfide system, a laminate of the translucent resins and so on. As a material of a non-translucent substrate, there are stainless steel, non-translucent resins and so on.

Moreover, undulations may be formed on the surface of the substrate 1001, and in this case, various effects of optical confinement, antireflection and so on can be obtained by the refraction, scattering and so on of light on the undulated surface. Moreover, it is acceptable to provide a coating of a metal film, a semiconductor film, an insulator, a composite film of the materials and the like on the surface of the substrate 1001. The thickness of the substrate 1001 is not specifically limited but required to have appropriate strength and weight capable of supporting the structure, and a thickness of 0.1 mm to 40 mm can be adopted as the thickness of the substrate 1001.

The form of the first electrode layer 1002 may have any form so long as it is substantially put in ohmic contact with the photoelectric conversion layer 1003, but the layer should preferably be formed in a film shape on the substrate 1001. The material used for the first electrode layer 1002 is not specifically limited so long as it has conductivity. Preferably, it is preferable to use a metal material of Mo, Al, Pt, Ti, Fe, Pd or the like, an alloy of the material or a transparent conductive electrode material represented by fluorine-doped tin oxide ($SnO_2$:F), antimony-doped tin oxide ($SnO_2$:Sb), tin-doped indium oxide ($In_2O_3$:Sn), Al-doped zinc oxide (ZnO:Al), Ga-doped zinc oxide (ZnO:Ga), B-doped zinc oxide (ZnO:B) and the like. Moreover, the first electrode layer 1002 may be a monolayer film of any of the materials described above or a laminate film in which a plurality of layers of the materials are layered.

When the first electrode layer 1002 is located on the light incidence side, the first electrode layer 1002 should preferably have a high translucency in an optical wavelength region that contributes to photoelectric conversion. The first electrode layer 1002 is formed by layering the component that becomes the material on the substrate 1001 by the gas phase method such as vacuum evaporation method, sputtering method, CVD method and PVD method, sol-gel method, CBD (chemical bus deposition) method, spraying method, screen printing method.

As described above, when the substrate 1001 is located on the light incidence side, the first electrode layer 1002 is required to have a high optical translucency. Therefore, in the case, the first electrode layer 1002 should preferably be formed of a metal electrode having a grid shape such as a comb-like shape of which the surface is not uniformly covered, a transparent conductive layer of a high optical translucency or by combining those requirements.

The first electrode layer 1002 should preferably have undulations on the surface thereof. The undulations existing on the surface of the first electrode layer 1002 refract and scatter light that has entered the inside of the photoelectric converter at an interface located between the first electrode layer 1002 and the photoelectric conversion layer 1003 formed on it. As a result, the optical path length of the incident light can be increased to allow the light confining effect to be improved, and the quantity of light that can be utilized in the photoelectric conversion layer 1003 can be increased. As a method for forming the undulations, a dry etching method, a wet etching method, mechanical processing like sand blasting or the like on the surface of the first electrode layer 1002 can be used.

As the dry etching method, there is chemical etching using a fluorine based gas such as $CF_4$ or $SF_6$, a chlorine based gas such as $CCl_4$ or $SiCl_4$, methane gas or the like besides physical etching using an inert gas such as Ar. As the wet etching method, there is a method for immersing the first electrode layer 1002 in an acid or alkaline solution or the like. In this case, there are mixtures of one kind or two or more kinds of hydrochloric acid, sulfuric acid, nitric acid, hydrofluoric acid, acetic acid, formic acid, perchloric acid and the like as acid solutions usable for wet etching. There are mixtures of one kind or two or more kinds of sodium hydroxide, ammonia, potassium hydroxide, calcium hydroxide, aluminum hydroxide and the like as alkaline solutions. As methods other than the etching method described above, there are a method for self-forming surface undulations by controlling the crystal growth of the material itself of the first electrode layer 1002 by the CVD method or the like and a method for forming surface undulations depending on the crystal grain shape by the sol-gel method or the spraying method.

The photoelectric conversion layer 1003 is formed on the first electrode layer 1002 substantially in mutual ohmic contact. The photoelectric conversion layer 1003 has a structure including a semiconductor layer in which Mg is added to iron sulfide. The structure of the photoelectric conversion layer 1003 is provided by a structure that includes a pn junction having a p-type semiconductor layer and an n-type semiconductor layer, a structure that includes a pin junction having a p-type semiconductor layer, an intrinsic (i-type) semiconductor layer and an n-type semiconductor layer, a Schottky junction of a semiconductor layer and a metal layer, a structure that includes a semiconductor junction such as a MIS structure or the like.

It is noted that the i-type semiconductor layer may exhibit a weak p-type or weak n-type conductive type so long as the photoelectric conversion function is not impaired. Moreover, the photoelectric converter may have a structure in which two or more photoelectric conversion layers are layered, and the photoelectric converter may be a so-called laminate type photoelectric converter.

It is described that the forbidden bandwidth of iron sulfide is within a range of 0.8 to 0.9 eV in the case of a thin film that contains an amorphous element or the like or within a range of 0.9 to 0.95 eV in the case of a pyrite type crystal on p. 184 of Altermatt et al.

The present inventor discovered that a semiconductor layer in which the forbidden bandwidth is controlled to the desired value within a range of 0.95 to 1.26 eV could be obtained when Mg was added to iron sulfide by carrying out ($\Omega\alpha$) two plotting based on the transmission/reflection measurement of light. In detail, it was discovered that a semiconductor layer in which the forbidden bandwidth was controlled to the desired value within the range of 0.95 to 1.26 eV could be obtained when Mg was added to iron sulfide from a change in the optical forbidden bandwidth estimated from an x-segment of a straight line obtained by using the least squares method from an appropriate range of the two plotting.

In this case, it was discovered that the forbidden bandwidth of iron sulfide largely changed within a range in which the Mg concentration (Mg/Fe) was 0.1 at % to 10 at % and thereafter exhibited a tendency of saturation. Then, it was discovered that a concentration range of 0.1 at % to 10 at % should properly be used when the forbidden bandwidth was desired to be controlled little by little or a concentration range of 10 at % to 45 at % should properly be used when a wide forbidden bandwidth was desired to be stably obtained. It is noted that the Mg concentration in iron sulfide can be evaluated by the well-known element analysis method such as the secondary ion mass spectrometry (SIMS) and the Auger electron spectroscopy. Moreover, when the forbidden bandwidth is desired to be further increased, iron sulfide is made to contain $FeS_2$ of a pyrite type crystal structure. This is because $FeS_2$ of a pyrite type crystal structure produces a high forbidden bandwidth increasing effect by virtue of Mg contained.

Control of the carrier density is extremely important in considering application. In this case, the present inventor conducted experiments on various elements since the carrier density control technique of the semiconductor layer achieved by adding Mg to iron sulfide has not yet been clarified. Then, the carrier density control technique described below was found.

That is, when a group Ia element is further added to the semiconductor layer obtained by adding Mg to iron sulfide, the hole carrier density can be increased. In this case, if Na is selected as the group Ia element to be added, the hole carrier density can particularly be increased.

On the other hand, when a group III element is further added to the semiconductor layer obtained by adding Mg to iron sulfide, the electron carrier density can be increased. In this case, if Al is selected as the group III element to be added, the electron carrier density can particularly be increased. It is noted that the carrier density can be evaluated by, for example, Hall measurement using the van der Pauw method.

According to the photoelectric converter of the example 101, the forbidden bandwidth, the carrier type and the carrier density of the iron sulfide semiconductor can be independently controlled by arbitrarily adjusting the Mg concentration in iron sulfide or adding an appropriate element to the semiconductor layer obtained by adding Mg to iron sulfide, and a semiconductor layer suitable for application can be formed.

As a method for manufacturing the photoelectric conversion layer 1003, well-known manufacturing methods such as MBE method, CVD method, vapor deposition method, close-spaced sublimation method, sputtering method, sol-gel method, spraying method, CBD (chemical bus deposition) method, screen printing method and the like can be used. Moreover, atmospheric pressure CVD, low-pressure CVD, plasma CVD, thermal CVD, hot-wire CVD, MOCVD method and the like can be enumerated as CVD methods. Details of the manufacturing method are as described in detail in, for example, Altermatt et al. or the cited documents described in it.

In this case, sulfide treatment in a sulfur vapor or a hydrogen sulfide atmosphere should preferably be carried out at need. A sulfide treatment temperature of 200° C. to 600° C. is preferable. If the sulfide treatment is carried out, it is allowed to promote the crystallization of the amorphous component, increase the percentage content of sulfur in iron sulfide and increase the ratio of $FeS_2$ of a pyrite type crystal structure.

In this case, the ratio of the amorphous component can be estimated by carrying out an XRD measurement. In detail, the estimation can be made by comparing the peak intensity of the XRD measurement in the layer in which the crystal component is detected with the peak intensity of the layer that has the same film thickness as the layer in which the crystal component is detected and is obtained by sufficient crystallization. Moreover, the ratio of $FeS_2$ having the pyrite type crystal structure can be estimated by comparing the XRD peak intensity of $FeS_2$ of the pyrite structure with the XRD peak intensity of iron sulfide of the other structures.

Finally, the second electrode layer 1004 is formed on the photoelectric conversion layer 1003, completing the essential part of the photoelectric converter. In detail, the essential part of the photoelectric converter is formed by forming the second electrode layer 1004 on the photoelectric conversion layer 1003 substantially in mutual ohmic contact by using a material and a manufacturing method similar to those of the electrode layer 1002.

Figure 7:
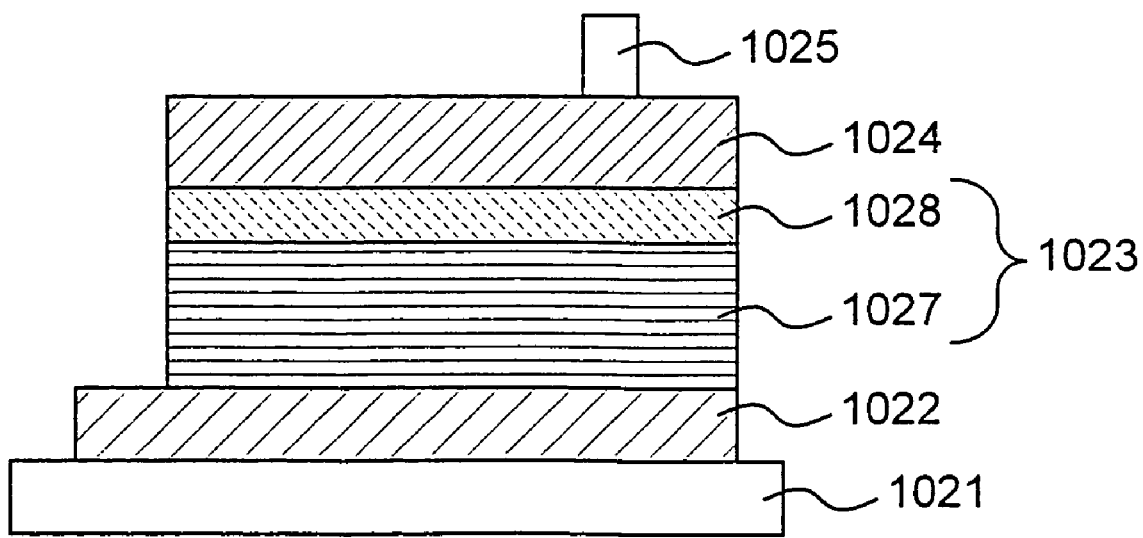
FIG. 7 is a schematic sectional view of the photoelectric converter of one embodiment of the present invention.

FIG. 7 is a sectional view of the photoelectric converter of another embodiment of the present invention.

The photoelectric converter has a substrate 1021, a first electrode layer 1022 formed in a surface region of at least part of the substrate 1021, a photoelectric conversion layer 1023 formed on the first electrode layer 1022, a transparent electrode layer 1024 formed on the photoelectric conversion layer 1023 and a grid electrode layer 1025 formed in a surface region of at least part of the transparent electrode layer 1024. The photoelectric conversion layer 1023 is constituted of a p-type semiconductor layer 1027 formed on the first electrode layer 1022 and an n-type semiconductor layer formed on the p-type semiconductor layer 1027.

The first electrode layer 1022 is formed on the substrate 1021 by the same method as in the previous example. The photoelectric conversion layer 1023 has a pn junction structure constituted of the p-type semiconductor layer 1027 including a semiconductor layer obtained by adding Mg to iron sulfide and the n-type semiconductor layer 1028. The p-type semiconductor layer 1027 is formed on the first electrode layer 1022 substantially in mutual ohmic contact. As a method for forming the p-type semiconductor layer 1027 on the first electrode layer 1022, the same method as the method for forming the photoelectric conversion layer 1003 on the first electrode layer 1002 in the previous example can be used.

The n-type semiconductor layer 1028 is formed on the p-type semiconductor layer 1027. In this case, the n-type semiconductor layer 1028 is formed on the p-type semiconductor layer 1027 so that a forbidden bandwidth Eg1 of the p-type semiconductor layer 1027 and a forbidden bandwidth Eg2 of the n-type semiconductor layer 1028 has a relation: Eg1<Eg2. The n-type semiconductor layer 1028 is not specifically limited so long as it is an n-type semiconductor layer that satisfies the relation: Eg1<Eg2, and representative ones are an iron sulfide semiconductor, an oxide, a sulfide, a hydroxide or the like of Zn or Mg. The forbidden bandwidth Eg1 of the p-type semiconductor layer 1027 is controlled so as to have a forbidden bandwidth corresponding to the application purpose for use as a photoactive layer. In this case, the n-type semiconductor layer 1028 should preferably have a small absorption of light in the objective wavelength band. The above object can be accomplished when the relation: Eg1<Eg2 is satisfied, and a high photoelectric conversion efficiency can be achieved. Moreover, the n-type semiconductor layer 1028 should preferably contain Mg. If the n-type semiconductor layer 1028 contain Mg, a satisfactory rectification characteristic can be obtained between the n-type semiconductor layer 1028 and the p-type semiconductor layer 1027 obtained by adding Mg to iron sulfide.

As a method for manufacturing the n-type semiconductor layer 1028, there are well-known manufacturing methods such as MBE method, CVD method, vapor deposition method, close-spaced sublimation method, sputtering method, sol-gel method, spraying method, CBD (chemical bus deposition) method, screen printing method and the like. There are atmospheric pressure CVD, low-pressure CVD, plasma CVD, thermal CVD, hot-wire CVD, MOCVD and the like as the CVD method. In this case, a sulfide treatment can be carried out in a sulfur vapor or a hydrogen sulfide atmosphere at need. The sulfide treatment temperature should preferably be 200 to 600° C. If the sulfide treatment is carried out, it is allowed to improve the crystallization rate and reduce the sulfur deficiency in the case of the iron sulfide semiconductor. Moreover, in the case of oxides, sulfides, hydroxides and so on of Zn or Mg, the ratio of sulfide can be increased by carrying out partial sulfurization, and it is allowed to increase the forbidden bandwidth and increase the electrical resistance.

Moreover, the Mg concentration in the p-type semiconductor layer 1027 should preferably be the height at the pn interface and reduced as located apart from the interface. High photoelectric conversion efficiency can be obtained by virtue of the fact that a change in the Mg concentration inside the p-type semiconductor layer 1027 has a concentration gradient reduced as located apart from the interface. It is noted that the Mg concentration in the device structure can be evaluated by analyzing the depthwise direction by using the well-known element analysis methods of secondary ion mass spectrometry (SIMS), Auger electron spectroscopy or the like. Moreover, as a method for forming the concentration gradient of Mg, there is, for example, a method for making the n-layer or the p/n interface contain Mg and thereafter carrying out heat treatment at a temperature of 200 to 500° C. By so doing, the concentration gradient can be controlled by the heat treatment condition.

The transparent electrode layer 1024 is formed on the photoelectric conversion layer 1023 substantially in mutual ohmic contact. In concrete, the transparent electrode layer 1024 is formed on the photoelectric conversion layer 1023 by using the same material and manufacturing method as those in the case where translucency is provided in the description of the first electrode layer 1002 in the previous example.

The grid electrode layer 1025 is formed on a surface region of part of the transparent electrode layer 1024. In concrete, the grid electrode layer 1025 is formed on a surface region of part of the transparent electrode layer 1024 by using the same material and manufacturing method as those of the electrode layer 1002 in the previous example. A photoelectric converter of high photoelectric conversion efficiency is thus formed.

Figure 8:
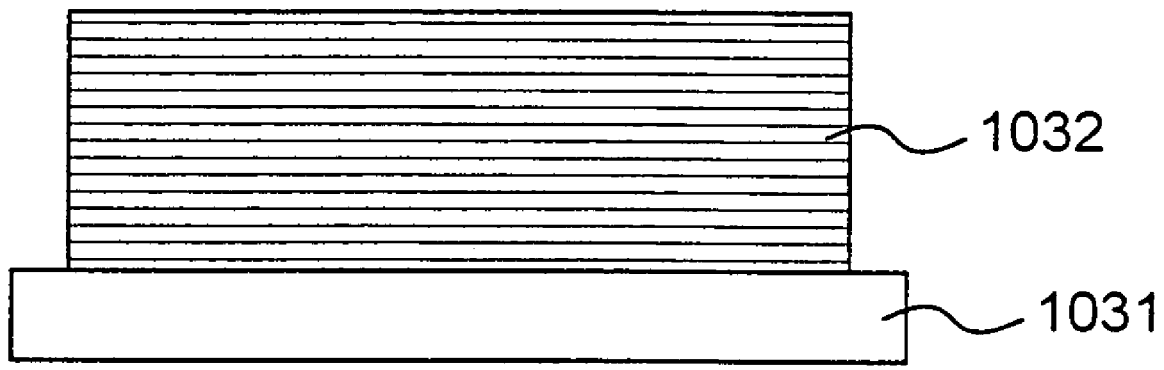
FIG. 8 is a schematic sectional view of the semiconductor of one embodiment of the present invention.

FIG. 8 is a schematic sectional view of the sulfide semiconductor of the examples 101 through 106 of the present invention and the sulfide semiconductor of a comparative example 101.

FIG. 9 described below is a table showing the kinds and concentrations of the compounds used for manufacturing the sulfide semiconductors of the examples 101 through 106 of the present invention and the sulfide semiconductor of the comparative example 101.

The sulfide semiconductors of the examples 101 through 106 are described below on the basis of FIGS. 8 and 9.

The sulfide semiconductors of the examples 101 through 106 are each manufactured by forming an iron sulfide layer 1032 on a glass substrate 1031 having a thickness of 1.1 mm using the spray pyrolysis method and the sulfurization method together.

In detail, a solution in which the concentration of iron chloride ($FeCl_2$) is 50 mmol/l and the concentration of thiourea ($NH_2CSNH_2$) is 100 mmol/l is produced by incorporating iron chloride ($FeCl_2$) and thiourea ($NH_2CSNH_2$) into, for example, 500 ml of pure water.

Next, a solution for spraying is produced by further dissolving magnesium chloride ($MgCl_2$) having the concentration (mmol/l) shown in FIG. 9 in the produced solution. Next, the glass substrate 1031 is heated to a temperature of about 200° C. on a hot plate in the atmosphere, and thereafter, a thin film is formed by spray coating of the solution on the hot plate.

It is confirmed that the peaks of oxide and hydroxide of iron are not observed by subjecting the thin film obtained by spray coating to an XRD measurement, and it is confirmed that the principal ingredient of the thin film is FeS.

Next, a sample in which a thin film is formed on the glass substrate 1031 is baked for one hour at a temperature of 500° C. in a sulfur vapor atmosphere. At this time, a sulfur vapor is generated by heating sulfur at a temperature of 150° C. by means of a heater other than the heater for heating the sample, and a nitrogen gas is flowed as a carrier gas at a rate of 5 l/min. It is confirmed that the single phase of $FeS_2$ pyrite is formed by carrying out an XRD measurement after the sulfide treatment. The thickness of the iron sulfide layer 1032 was measured by means of a level-difference thickness meter, and the thickness was 700 nm. The iron sulfide semiconductor shown in FIG. 8 is thus manufactured.

The conductive type shown in FIG. 9 is determined on the basis of the result of Hall measurement. The Hall measurement conditions are as follows. Al was used as an electrode material, and the van der Pauw method was used for the electrode structure. The measurement was carried out by means of RESITEST8300 of a product of TOYO Corporation on the conditions of a magnetic field maximum amplitude of 0.6 T and a magnetic field frequency of 0.1 Hz at a room temperature in a dry nitrogen atmosphere. Moreover, the Mg/Fe ratios shown in FIG. 9 are determined on the basis of the result of Auger electron spectroscopy measurement. Moreover, Eg (eV) is determined on the basis of optical bandgap (Eg) measurement.

In this case, Eg was calculated by obtaining an optical absorption coefficient α from the optical transmittance and reflectance measurements and plotting the second power ($\omega^2\alpha^2$) of the optical absorption coefficient with respect to the energy of incident light on the basis of the x-segment of a straight line obtained by the least squares method from an appropriate range of the plot. That is, a direct transition bandgap was obtained from the x-segment.

Moreover, the concentration (mmol/l) shown in FIG. 9 represents the concentration of magnesium chloride ($MgCl_2$) used for producing a solution for spraying.

As shown in FIG. 9, the carrier type was the p-type in any of the comparative example 101 in which Mg is not contained and the examples 101 through 106 in which Mg is contained. Moreover, if the examples 101 through 106 are compared with one another, Eg steeply increases as the Mg concentration increases up to 10% of the Mg/Fe ratio and subsequently exhibits a tendency of saturation. Therefore, the forbidden bandwidth can be controlled by making iron sulfide contain Mg.

A doped semiconductor layer is described next.

The sulfide semiconductor of the example 107 and the example 108 of the present invention is a doped semiconductor layer. The sulfide semiconductors of the example 107 and the example 108 have a schematic sectional view shown in FIG. 8 as in the examples 101 through 106.

FIG. 10 described below is a table showing the kinds and concentrations of the compounds used for manufacturing the sulfide semiconductors of the example 107 and the example 108 of the present invention and the sulfide semiconductor of the comparative example 101.

The semiconductor layers of the example 107, the example 108 and the comparative example 101 are described below on the basis of FIGS. 8 and 10.

The iron sulfide semiconductor of the example 107 and the example 108 is manufactured by forming an iron sulfide layer 1032 on a glass substrate 1031 having a thickness of 1.1 mm using the spray pyrolysis method and the sulfurization method together.

In detail, solutions for spraying are produced by further dissolving compounds (NaCl in the case of the p-type and $AlCl_3$ in the case of the n-type) containing impurities for control to the conductive types shown in FIG. 10 in the solution for spraying used in the example 104. Next, the glass substrate 1031 is heated to a temperature of about 200° C. on a hot plate in the atmosphere, and thereafter, a thin film is formed by spray coating of the solution on the hot plate.

It is confirmed that the peaks of oxide and hydroxide of iron are not observed by subjecting the thin film obtained by spray coating to an XRD measurement. From this fact, it is confirmed that the principal ingredient of the thin film is FeS.

Next, a sample in which a thin film is formed on the glass substrate 1031 is baked for one hour at a temperature of 500° C. in a sulfur vapor atmosphere. At this time, a sulfur vapor is generated by heating sulfur at a temperature of 150° C. by means of a heater other than the heater for heating the sample, and a nitrogen gas is flowed as a carrier gas at a rate of 5 l/min. It is confirmed that the single phase of $FeS_2$ pyrite is formed by carrying out an XRD measurement after the sulfide treatment. The thickness of the iron sulfide layer 1032 was measured by means of a level-difference thickness meter, and the thickness was 700 nm. The iron sulfide semiconductor is thus manufactured.

The conductive types and the carrier densities shown in FIG. 10 are determined on the basis of the result of Hall measurement. The Hall measurement conditions are as follows. Al was used as an electrode material, and the van der Pauw method was used for the electrode structure. The measurement was carried out by means of RESITEST8300 of a product of TOYO Corporation on the conditions of a magnetic field maximum amplitude of 0.6 T and a magnetic field frequency of 0.1 Hz at a room temperature in a dry nitrogen atmosphere. Moreover, the intra-film element concentrations (Na concentration in the case of the p-type and Al concentration in the case of the n-type) shown in FIG. 10 are determined on the basis of the result of Auger electron spectroscopy measurement.

As shown in FIG. 10, the carrier type was the p-type and the carrier density was $1 \times 10^{17}$ cm$^{-3}$ in the comparative example 101 that has not undergone doping. Moreover, the carrier type was the p-type and the carrier density was $1 \times 10^{19}$ cm$^{-3}$ in the example 107 in which Na was contained.

From this fact, the hole carrier density can be increased when Na is contained in iron sulfide containing Mg. Moreover, the carrier type was the n-type and the carrier density was $8 \times 10^{18}$ cm$^{-3}$ in the example 108 in which Al is contained. From this fact, the electron carrier density can be increased when Al is contained in iron sulfide containing Mg. As described above, the forbidden bandwidth, the carrier type and the carrier density of the iron sulfide semiconductor can be independently controlled, and a semiconductor layer suitable for application can be obtained.

The photoelectric converter is described next.

The photoelectric converter devices of examples 109 through 112 of the present invention have a sectional view shown in FIG. 7. FIG. 11 is a table showing the kinds of the n-type semiconductor layers owned by the photoelectric converters of the examples 109 through 112 and the photoelectric conversion efficiencies of the photoelectric converters employing the layers.

The photoelectric converters of the examples 109 through 112 are described below on the basis of FIGS. 7 and 11.

The photoelectric converters of the examples 109 through 112 each have a substrate 1021, a first electrode layer 1022 formed in a surface region of at least part of the substrate 1021, a photoelectric conversion layer 1023 formed on the first electrode layer 1022, a transparent electrode layer 1024 formed on the photoelectric conversion layer 1023 and a grid electrode layer 1025 formed in a surface region of at least part of the transparent electrode layer 1024.

The photoelectric conversion layer 1023 is constituted of a p-type semiconductor layer 1027 formed on the first electrode layer 1022 and an n-type semiconductor layer 1028 formed on the p-type semiconductor layer 1027. In this case, the photoelectric converters of the examples 109 through 112 are similar except for the point that the materials and manufacturing methods of the n-type semiconductor layer 1028 are different.

The photoelectric converter of the example 109 is formed as follows.

First of all, a Pt film having a thickness of 500 nm is formed by the vacuum evaporation method on the glass substrate 1021 that has a plate thickness of, for example, 1.1 mm, and the first electrode layer 1022 is formed by depositing n-type gallium-doped zinc oxide (ZnO:Ga) by 700 nm on it by the magnetron sputtering method. Next, a p-type semiconductor layer 1027 constituted of $FeS_2$ pyrite containing Mg is formed on the first electrode layer 1022 by using the spray pyrolysis method and the sulfurization method together. In detail, in forming the p-type $FeS_2$ pyrite containing Mg, the same solution as that of the example 103 of FIG. 9 is used as a spray solution for the p-type, and a thin film is formed by heating the glass substrate 1021 on which the first electrode layer 1022 is layered to a temperature of about 200° C. on a hot plate in the atmosphere and spray coating of the solution on it.

Next, the processed resultant is baked at a temperature of 500° C. in a sulfur vapor atmosphere. At this time, a sulfur vapor is generated by heating sulfur at a temperature of 150° C. by means of a heater other than the heater for heating the sample, and a nitrogen gas is flowed as a carrier gas at a rate of 5 l/min. In this case, it is confirmed that the single phase of $FeS_2$ pyrite is formed by carrying out an XRD measurement after the sulfide treatment. In one experimental example, the film thickness of the $FeS_2$ pyrite film was 2 μm. The layers up to the p-type semiconductor layer 1027 are thus formed.

Subsequently, spray coating is carried out again to produce n-type $FeS_2$ pyrite on p-type $FeS_2$ pyrite. In detail, in producing the n-type $FeS_2$ pyrite containing Mg and Al, a solution obtained by diluting twentyfold the same solution as that of the example 108 of FIG. 10 is used as a spray solution for the n-type. A thin film is formed by heating the substrate, on which the p-type $FeS_2$ pyrite has been formed, to a temperature of about 100° C. on the hot plate in the atmosphere and spray coating of the solution on it. At this time, the frequency of spraying is adjusted so that the film thickness becomes 50 nm, and thereafter, baking is carried out at a temperature of 500° C. in a sulfur vapor atmosphere as in the case of the p-type. In this case, baking time was set to ten minutes. The photoelectric conversion layer 1023 constituted of the p-type semiconductor layer 1027 formed on the electrode layer 1022 and the n-type semiconductor layer 1028 formed on the p-type semiconductor layer 1027 is thus formed. In this case, the forbidden bandwidth of the p-type semiconductor layer 1027 is obviously equal to that of the example 103 because of the spray solution used for the manufacturing. The forbidden bandwidth of the n-type semiconductor layer 1028 was 1.29 eV as the result of producing the $FeS_2$ pyrite on the glass substrate in a manner similar to the method described above and measuring the forbidden bandwidth as in the examples 101 through 106. From this fact, the relation: Eg1<Eg2 was able to be satisfied.

Subsequently, the transparent conductive film 1024 is formed by depositing n-type gallium-doped zinc oxide (ZnO:Ga) by 700 nm on the photoelectric conversion layer 1023 by the magnetron sputtering method, and thereafter, the grid electrode layer 1025 is formed by forming a comb-like shape of silver (Ag) on the transparent conductive film 1024 by the magnetron sputtering method. The photoelectric converter shown in FIG. 7 is thus formed.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. Then, the results shown in FIG. 11 were obtained.

Next, the photoelectric converter of the example 110 is formed as follows. The layers up to the p-type semiconductor layer 1027 are formed as in the example 109. Subsequently, spray coating is carried out again to produce n-type $FeS_2$ pyrite on p-type $FeS_2$ pyrite. In detail, in producing an n-type $FeS_2$ pyrite containing Mg and Al, the photoelectric converter shown in FIG. 7 is formed by using a solution obtained by adding $AlCl_3$ to the same solution as that of the example 101 of FIG. 9 so that $AlCl_3$ comes to have a concentration of 100 mmol/l and thereafter diluting twentyfold the resulting solution with pure water as a spray solution for the n-type with the subsequent steps made similar to those of the example 109. In this case, the forbidden bandwidth of the p-type semiconductor layer 1027 in the example 110 is obviously equal to that of the example 103 because of the spray solution used for the manufacturing. The forbidden bandwidth of the n-type semiconductor layer 1028 was 1.10 eV as the result of producing $FeS_2$ pyrite on a glass substrate in a manner similar to the method described above and measuring the forbidden bandwidth as in the examples 101 through 106. Therefore, the relation: Eg1>Eg2 holds.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 11.

Next, the photoelectric converter of the example 111 is formed as follows. The layers up to the p-type semiconductor layer 1027 are formed as in the example 109.

Subsequently, spray coating is carried out again to produce n-type ZnO on p-type $FeS_2$ pyrite. In detail, in producing n-type ZnO having oxygen deficiency, a solution is produced as a spray solution for the n-type by incorporating zinc chloride ($ZnCl_2$) into 500 ml of pure water so that zinc chloride ($ZnCl_2$) has a concentration of 5 mmol/l and used as a solution for spraying. Next, a thin film is formed by heating the substrate, on which the p-type $FeS_2$ pyrite has been formed, to a temperature of about 100° C. on a hot plate in the atmosphere and spray coating of the solution on it. At this time, the frequency of spraying is adjusted so that the film thickness becomes 200 nm, and thereafter, the processed resultant is heated to a temperature of about 200° C. on the hot plate in the atmosphere and dried and oxidized for ten minutes. Then, the photoelectric conversion layer 1023 constituted of the p-type semiconductor layer 1027 formed on the electrode layer 1022 and the n-type semiconductor layer 1028 formed on the p-type semiconductor layer 1027 is formed. In this case, n-type ZnO is produced on a glass substrate as in the method described above, and the resistivity and the forbidden bandwidth were measured. The resistivity was $2\times10^{-9}$ Ωcm as the result of measurement after the layering of a comb-type Ag electrode. The forbidden bandwidth was 3.4 eV as the result of obtainment by a method similar to that in the case of iron sulfide. Therefore, the relation: Eg1<Eg2 is satisfied.

Subsequently, the transparent conductive film 1024 is formed by depositing n-type gallium-doped zinc oxide (ZnO: Ga) by 700 nm on the photoelectric conversion layer 1023 by the magnetron sputtering method, and thereafter, the grid electrode 1025 is formed by forming a comb-like shape of silver (Ag) on the transparent conductive film 1024 by the magnetron sputtering method. The photoelectric converter shown in FIG. 7 is thus formed.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 11.

Next, the photoelectric converter of the example 112 is formed as follows. The layers up to the p-type semiconductor layer 1027 are formed as in the example 109.

Subsequently, spray coating is carried out again to produce n-type ZnO on p-type FeS$_2$ pyrite. In detail, in producing n-type ZnO that contains Mg and has oxygen deficiency, a solution is produced as a spray solution for the n-type by incorporating zinc chloride (ZnCl$_2$) and magnesium chloride (MgCl$_2$) into 500 ml of pure water so that zinc chloride (ZnCl$_2$) has a concentration of 5 mmol/l and magnesium chloride (MgCl$_2$) has a concentration of 0.5 mmol/l and used as a solution for spraying. The photoelectric converter shown in FIG. 7 is formed with the subsequent steps made similar to those of the example 111.

In this case, n-type ZnO was produced on a glass substrate in a manner similar to the method described above, and the resistivity and the forbidden bandwidth were measured. The resistivity was $2\times10^{-9}$ Ωcm as the result of measurement after the layering of a comb-shaped Ag electrode. The forbidden bandwidth was 3.5 eV as the result of obtainment by a method similar to that in the case of iron sulfide. Therefore, the relation: Eg1<Eg2 is satisfied.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 11.

As shown in FIG. 11, all of the photoelectric converters of the examples 109 through 112 exhibited a rectification property, and the conversion efficiency of each photoelectric converter had a high value exceeding 2%. From this fact, a satisfactory pn junction can be provided when an iron sulfide semiconductor containing iron sulfide and Mg.

Moreover, if the example 110 in which the relation: Eg1>Eg2 holds between the forbidden bandwidth Eg1 of the p-type semiconductor and the forbidden bandwidth Eg2 of the n-type semiconductor is compared with the examples 109, 111 and 112 in which Eg1<Eg2, it can be understood that the latter has a higher photoelectric conversion efficiency. Therefore, higher photoelectric conversion efficiency can be provided when the forbidden bandwidth has the relation: Eg1<Eg2.

Moreover, if the example 111 in which the n-type ZnO semiconductor layer containing no Mg is employed is compared with the example 112 in which the n-type ZnO semiconductor layer containing Mg is employed, it can be understood that the latter has a higher photoelectric conversion efficiency. Therefore, when the n-type semiconductor layer contains Mg, a satisfactory rectification characteristic can be obtained, and a higher photoelectric conversion efficiency be provided.

Although the photoelectric converter was manufactured by employing the pn junction constituted of the p-type semiconductor and the n-type semiconductor of the present invention in the examples 109 through 112, it is, of course, acceptable to manufacture pn junction devices such as diodes, transistors (pnp transistor, npn transistor and pnip transistor) and switches (pnpm switch and pnpn switch) having a pn junction device by employing the pn junction constituted of the p-type semiconductor and the n-type semiconductor of the present invention. If a pn junction device is produced by employing the pn junction constituted of the p-type semiconductor and the n-type semiconductor of the present invention, the rectification characteristic of the pn junction device can be remarkably improved, and the device characteristics of the pn junction device can be remarkably improved.

Figure 12:
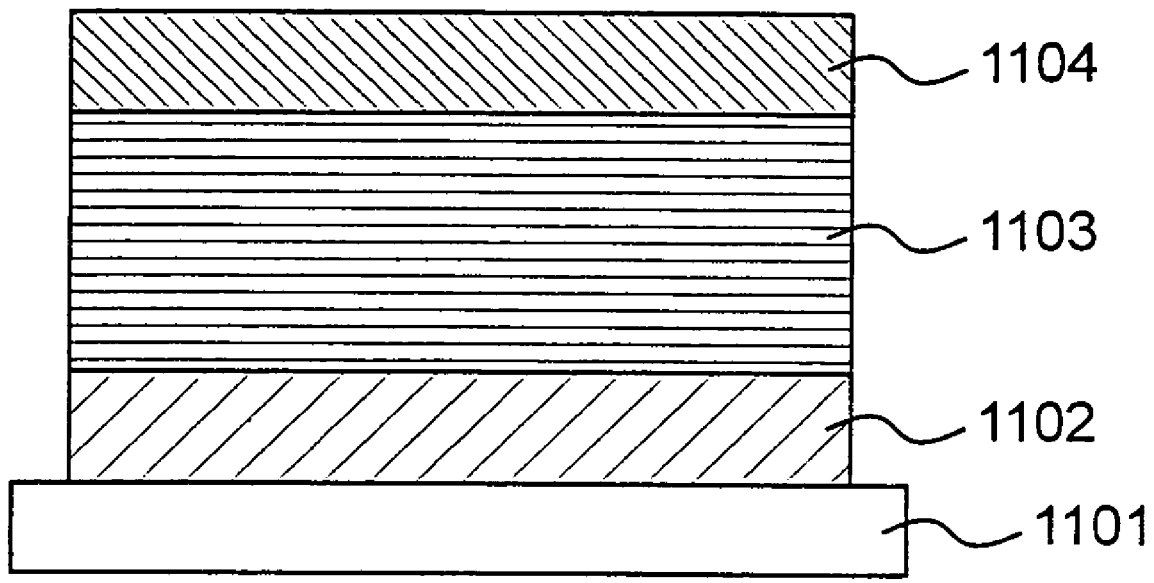
FIG. 12 is a schematic sectional view of the photoelectric converter of one embodiment of the present invention.

FIG. 12 is a sectional view of the photoelectric converter of one embodiment of the present invention.

The photoelectric converter has a substrate 1101, an electrode layer 1102 formed on a surface region of at least part of the substrate 1101, a photoelectric conversion layer 1103 formed on the electrode layer 1102 and a second electrode layer 1104 formed on the photoelectric conversion layer 1103.

It makes no matter whether or not the substrate 1101 has translucency when the substrate 1101 is located on the side opposite from the light incidence side, while at least part of the substrate 1101 should preferably have translucency when the substrate 1101 is located on the light incidence side. As a material of the translucent substrate, there are glass, translucent resins of a polyimide system, a polyvinyl system or a polysulfide system having a certain heat resistance, a laminate of the materials and so on. As a material of a non-translucent substrate, there are stainless steel, non-translucent resins and so on.

Moreover, undulations may be formed on the surface of the substrate 1101, and in this case, various effects of optical confinement, antireflection and so on can be obtained by the refraction, scattering and so on of light on the undulated surface. Moreover, it is acceptable to provide a coating of a metal film, a semiconductor film, an insulator, a composite film of the materials or the like on the surface of the substrate 1101. The thickness of the substrate 1101 is not specifically limited but required to have appropriate strength and weight capable of supporting the structure, and a thickness of 0.1 mm to 40 mm can be adopted as the thickness of the substrate 1101.

The form of the electrode layer 1102 may have any form so long as it is substantially put in ohmic contact with the photoelectric conversion layer 1103, but the layer should preferably be formed in a film shape on the substrate 1101. The material used for the first electrode layer 1102 is not specifically limited so long as it has conductivity. However, it is preferable to use a metal material of Mo, Al, Pt, Ti, Fe, Pd or the like, an alloy of the material or a transparent conductive electrode material represented by fluorine-doped tin oxide ($SnO_2$:F), antimony-doped tin oxide ($SnO_2$:Sb), tin-doped indium oxide ($In_2O_3$:Sn), Al-doped zinc oxide (ZnO:Al), Ga-doped zinc oxide (ZnO:Ga), B-doped zinc oxide (ZnO:B) and the like. Moreover, the first electrode layer 1102 may be a monolayer film of any of the materials described above or a laminate film in which a plurality of layers of the materials are layered.

When the first electrode layer 1102 is located on the light incidence side, the first electrode layer 1102 should preferably have a high translucency in an optical wavelength region that contributes to photoelectric conversion. The first electrode layer 1102 is formed by layering the component that becomes the material on the substrate 1101 by a gas phase method such as vacuum evaporation method, sputtering method, CVD method and PVD method, sol-gel method, CBD (chemical bus deposition) method, spraying method, screen printing method and the like.

As described above, when the substrate 1101 is located on the light incidence side, the first electrode layer 1102 is required to have a high optical translucency. Therefore, the first electrode layer 1102 should preferably be formed of a metal electrode having a grid shape such as a comb-like shape of which the surface is not uniformly covered, a transparent conductive layer of a high optical translucency or by combining those requirements.

The first electrode layer 1102 should preferably have undulations on the surface thereof. The undulations existing on the surface of the first electrode layer 1102 refract and scatter light that has entered the inside of the photoelectric converter at an interface located between the first electrode layer 1102 and the photoelectric conversion layer 1103 formed on it. As a result, the optical path length of the incident light can be made long to allow the light confining effect to be improved, and the quantity of light that can be utilized in the photoelectric conversion layer 1103 can be increased. As a method for forming the undulations, a dry etching method, a wet etching method, mechanical processing like sand blasting or the like on the surface of the first electrode layer 1102 can be used.

As the dry etching method, there is chemical etching using a fluorine based gas such as $CF_4$ or $SF_6$, a chlorine based gas such as $CCl_4$ or $SiCl_4$, methane gas or the like besides physical etching using an inert gas such as Ar. As the wet etching method, there is a method for immersing the first electrode layer 1102 in an acid or alkaline solution or the like. In this case, there are mixtures of one kind or two or more kinds of hydrochloric acid, sulfuric acid, nitric acid, hydrofluoric acid, acetic acid, formic acid, perchloric acid and the like as usable acid solutions. There are mixtures of one kind or two or more kinds of sodium hydroxide, ammonia, potassium hydroxide, calcium hydroxide, aluminum hydroxide and the like as alkaline solutions. As methods other than the etching method described above, there are a method for self-forming surface undulations by controlling the crystal growth of the material itself of the first electrode layer 1102 by the CVD method or the like and a method for forming surface undulations depending on the crystal grain shape by the sol-gel method or the spraying method.

The photoelectric conversion layer 1103 is formed on the first electrode layer 1102 substantially in mutual ohmic contact. The photoelectric conversion layer 1103 has a structure including a semiconductor layer in which Zn is added to iron sulfide. The structure of the photoelectric conversion layer 1103 is provided by a structure that includes a pn junction having a p-type semiconductor layer and an n-type semiconductor layer, a structure that includes a pin junction having a p-type semiconductor layer, an intrinsic (i-type) semiconductor layer and an n-type semiconductor layer, a Schottky junction of a semiconductor layer and a metal layer, a structure that includes a semiconductor junction such as a MIS structure or the like.

It is noted that the i-type semiconductor layer may exhibit a weak p-type or weak n-type conductive type so long as the photoelectric conversion function is not impaired. Moreover, the photoelectric converter may have a structure in which two or more photoelectric conversion layers are layered, and the photoelectric converter may be a so-called laminate type photoelectric converter.

It is described that the forbidden bandwidth of iron sulfide is within a range of 0.8 to 0.9 eV in the case of a thin film that contains an amorphous element or the like or within a range of 0.9 to 0.95 eV in the case of a pyrite type crystal on p. 184 of Altermatt et al.

The present inventor discovered that a semiconductor layer in which the forbidden bandwidth is controlled to the desired value within a range of 0.95 to 1.26 eV could be obtained when Zn was added to iron sulfide by carrying out ($\omega\alpha$) two plotting based on the transmission/reflection measurement of light. In detail, it was discovered that a semiconductor layer in which the forbidden bandwidth was controlled to the desired value within the range of 0.95 to 1.26 eV could be obtained when Zn was added to iron sulfide from a change in the optical forbidden bandwidth estimated from an x-segment of a straight line obtained by using the least squares method from an appropriate range of the two plotting.

In this case, it was discovered that the forbidden bandwidth of iron sulfide largely changed within a range in which the Zn concentration (Zn/Fe) was 0.1 at % to 30 at % and thereafter exhibited a tendency of saturation. Then, it was discovered that a concentration range of 0.1 at % to 30 at % should properly be used when the forbidden bandwidth was desired to be controlled little by little or a concentration range of 30 at % to 45 at % should properly be used when a wide forbidden bandwidth was desired to be stably obtained. It is noted that the Zn concentration in iron sulfide can be evaluated by the well-known element analysis method such as the secondary ion mass spectrometry (SIMS) and the Auger electron spectroscopy. Moreover, when the forbidden bandwidth is desired to be further increased, iron sulfide is made to contain $FeS_2$ of a pyrite type crystal structure. This is because $FeS_2$ of a pyrite type crystal structure produces a high forbidden bandwidth increasing effect by virtue of Zn contained.

Control of the carrier density is extremely important in considering application. In this case, the present inventor conducted experiments on various elements since the carrier density control technique of the semiconductor layer achieved by adding Zn to iron sulfide has not yet been clarified. Then, the carrier density control technique described below was found.

That is, when a group I element is further added to the semiconductor layer obtained by adding Zn to iron sulfide, the hole carrier density can be increased. In this case, if Na is selected as the group I element to be added, the hole carrier density can particularly be increased.

On the other hand, when a group III element is further added to the semiconductor layer obtained by adding Zn to iron sulfide, the electron carrier density can be increased. In this case, if Al is selected as the group III element to be added, the electron carrier density can particularly be increased. It is noted that the carrier density can be evaluated by, for example, Hall measurement using the van der Pauw method.

According to the photoelectric converter of the one example, the forbidden bandwidth, the carrier type and the carrier density of the iron sulfide semiconductor can be controlled independently by arbitrarily adjusting the Zn concentration in iron sulfide or adding an appropriate element to the semiconductor layer obtained by adding Zn to iron sulfide, and a semiconductor layer suitable for application can be formed.

As a method for manufacturing the photoelectric conversion layer 1103, well-known manufacturing methods such as MBE method, CVD method, vapor deposition method, close-spaced sublimation method, sputtering method, sol-gel method, spraying method, CBD (chemical bus deposition) method, screen printing method and the like can be used. Moreover, atmospheric pressure CVD, low-pressure CVD, plasma CVD, thermal CVD, hot-wire CVD, MOCVD method and the like can be enumerated as CVD methods. Details of the manufacturing method are as described in detail in, for example, Altermatt et al. or the cited documents described in it.

In this case, sulfide treatment in a sulfur vapor or a hydrogen sulfide atmosphere should preferably be carried out at need. A sulfide treatment temperature of 200° C. to 600° C. is preferable. If the sulfide treatment is carried out, it is allowed to promote the crystallization of the amorphous component, increase the percentage content of sulfur in iron sulfide and increase the ratio of $FeS_2$ of a pyrite type crystal structure.

In this case, the ratio of the amorphous component can be estimated by carrying out an XRD measurement. In detail, the estimation can be made by comparing the peak intensity of the XRD measurement in the layer in which the crystal component is detected with the peak intensity of the layer that has the same film thickness as the layer in which the crystal component is detected and is obtained by sufficient crystallization. Moreover, the ratio of $FeS_2$ having the pyrite type crystal structure can be estimated by comparing the XRD peak intensity of $FeS_2$ of the pyrite structure with the XRD peak intensity of iron sulfide of the other structures.

Finally, the second electrode layer 1104 is formed on the photoelectric conversion layer 1103, completing the essential part of the photoelectric converter. In detail, the essential part of the photoelectric converter is formed by forming the second electrode layer 1104 on the photoelectric conversion layer 1103 substantially in mutual ohmic contact by using a material and a manufacturing method similar to those of the electrode layer 1102.

Figure 13:
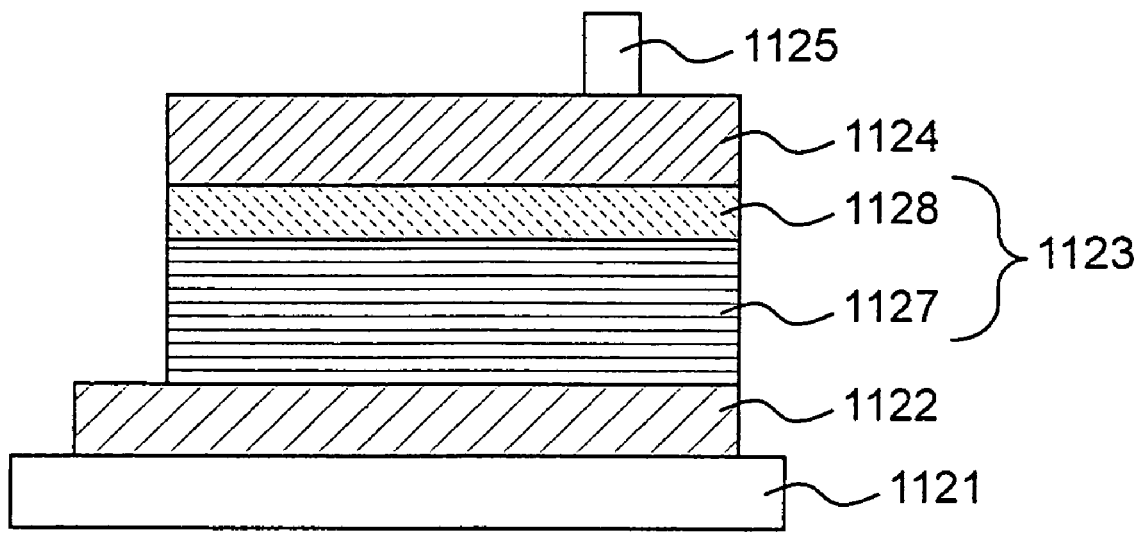
FIG. 13 is a schematic sectional view of the photoelectric converter of one embodiment of the present invention.

FIG. 13 is a sectional view of the photoelectric converter of another embodiment of the present invention.

The photoelectric converter has a substrate 1121, a first electrode layer 1122 formed in a surface region of at least part of the substrate 1121, a photoelectric conversion layer 1123 formed on the first electrode layer 1122, a transparent electrode layer 1124 formed on the photoelectric conversion layer 1123 and a grid electrode layer 1025 formed in a surface region of at least part of the transparent electrode layer 1124. The photoelectric conversion layer 1123 is constituted of a p-type semiconductor layer 1127 formed on the first electrode layer 1122 and an n-type semiconductor layer formed on the p-type semiconductor layer 1127.

The first electrode layer 1122 is formed on the substrate 1121 by the same method as in the previous example. The photoelectric conversion layer 1123 has a pn junction structure constituted of the p-type semiconductor layer 1127 including a semiconductor layer obtained by adding Zn to iron sulfide and the n-type semiconductor layer 1128. The p-type semiconductor layer 1127 is formed on the first electrode layer 1122 substantially in mutual ohmic contact. As a method for forming the p-type semiconductor layer 1127 on the first electrode layer 1122, the same method as the method for forming the photoelectric conversion layer 1103 on the first electrode layer 1102 in the previous example can be used.

The n-type semiconductor layer 1128 is formed on the p-type semiconductor layer 1127. In this case, the n-type semiconductor layer 1128 is formed on the p-type semiconductor layer 1127 so that a forbidden bandwidth Eg1 of the p-type semiconductor layer 1127 and a forbidden bandwidth Eg2 of the n-type semiconductor layer 1128 has a relation: Eg1<Eg2. The n-type semiconductor layer 1128 is not specifically limited so long as it is an n-type semiconductor layer that satisfies the relation: Eg1 <Eg2, and representative ones are an iron sulfide semiconductor, an oxide, a sulfide, a hydroxide or the like of Zn or Mg. The forbidden bandwidth Eg1 of the p-type semiconductor layer 1127 is controlled so as to have a forbidden bandwidth corresponding to the application purpose for use as a photoactive layer. In this case, the n-type semiconductor layer 1128 should preferably have a small absorption of light in the objective wavelength band. The above object can be accomplished when the relation: Eg1<Eg2 is satisfied, and a high photoelectric conversion efficiency can be achieved. Moreover, the n-type semiconductor layer 1128 should preferably contain Zn. If the n-type semiconductor layer 1128 contain Zn, a satisfactory rectification characteristic can be obtained between the n-type semiconductor layer 1128 and the p-type semiconductor layer 1127 obtained by adding Zn to iron sulfide.

As a method for manufacturing the n-type semiconductor layer 1128, there are well-known manufacturing methods such as MBE method, CVD method, vapor deposition method, close-spaced sublimation method, sputtering method, sol-gel method, spraying method, CBD (chemical bus deposition) method, screen printing method and the like. There are atmospheric pressure CVD, low-pressure CVD, plasma CVD, thermal CVD, hot-wire CVD, MOCVD and the like as the CVD method. In this case, a sulfide treatment can be carried out in a sulfur vapor or a hydrogen sulfide atmosphere at need. The sulfide treatment temperature should preferably be 200 to 600° C. If the sulfide treatment is carried out, it is allowed to improve the crystallization rate and reduce the sulfur deficiency in the case of the iron sulfide semiconductor. Moreover, in the case of oxides, sulfides, hydroxides and so on of Zn or Mg, the ratio of sulfide can be increased by carrying out partial sulfurization, and it is allowed to increase the forbidden bandwidth and increase the electrical resistance.

Moreover, the Zn concentration in the p-type semiconductor layer 1127 should preferably be the height at the pn interface and reduced as located apart from the interface. High photoelectric conversion efficiency can be obtained by virtue of the fact that a change in the Zn concentration inside the p-type semiconductor layer 1127 has a concentration gradient reduced as located apart from the interface. It is noted that the Zn concentration in the device structure can be evaluated by analyzing the depthwise direction by using the well-known element analysis methods of secondary ion mass spectrometry (SIMS), Auger electron spectroscopy or the like. Moreover, as a method for forming the concentration gradient of Zn, there is, for example, a method for making the n-layer or the p/n interface contain Zn and thereafter carrying out heat treatment at a temperature of 200 to 500° C. By so doing, the concentration gradient can be controlled by the heat treatment condition.

The transparent electrode layer 1124 is formed on the photoelectric conversion layer 1123 substantially in mutual ohmic contact. In concrete, the transparent electrode layer 1124 is formed on the photoelectric conversion layer 1123 by using the same material and manufacturing method as those in the case where translucency is provided in the description of the first electrode layer 102 in the previous example.

The grid electrode layer 1125 is formed on a surface region of part of the transparent electrode layer 1124. In concrete, the grid electrode layer 1125 is formed on a surface region of part of the transparent electrode layer 1124 by using the same material and manufacturing method as those of the electrode layer 1102 in the previous example. A photoelectric converter of high photoelectric conversion efficiency is thus formed.

Figure 14:
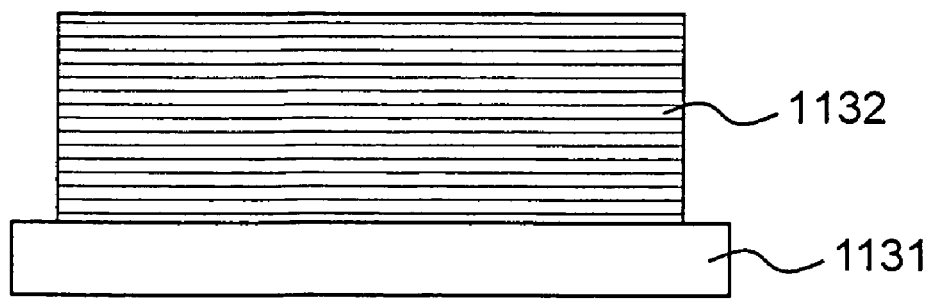
FIG. 14 is a schematic sectional view of the semiconductor of one embodiment of the present invention.

FIG. 14 is a schematic sectional view of the sulfide semiconductor of examples 113 through 118 of the present invention and the sulfide semiconductor of a comparative example 102.

FIG. 15 described below is a table showing the kinds and concentrations of the compounds used for manufacturing the sulfide semiconductors of the examples 113 through 118 of the present invention and the sulfide semiconductor of the comparative example 102.

The sulfide semiconductors of the examples 113 through 118 are described below on the basis of FIGS. 14 and 15.

The sulfide semiconductors of the examples 113 through 118 are each manufactured by forming an iron sulfide layer 1132 on a glass substrate 1031 having a thickness of 1.1 mm using the spray pyrolysis method and the sulfurization method together.

In detail, a solution in which the concentration of iron chloride ($FeCl_2$) is 50 mmol/l and the concentration of thiourea ($NH_2CSNH_2$) is 100 mmol/l is produced by incorporating iron chloride ($FeCl_2$) and thiourea ($NH_2CSNH_2$) into, for example, 500 ml of pure water.

Next, a solution for spraying is produced by further dissolving zinc chloride ($ZnCl_2$) having the concentration (mmol/l) shown in FIG. 15 in the produced solution. Next, the glass substrate 1131 is heated to a temperature of about 200° C. on a hot plate in the atmosphere, and thereafter, a thin film is formed by spray coating of the solution on the hot plate.

It is confirmed that the peaks of oxide and hydroxide of iron are not observed by subjecting the thin film obtained by spray coating to an XRD measurement, and it is confirmed that the principal ingredient of the thin film is FeS.

Next, a sample in which a thin film is formed on the glass substrate 1131 is baked for one hour at a temperature of 500° C. in a sulfur vapor atmosphere. At this time, a sulfur vapor is generated by heating sulfur at a temperature of 150° C. by means of a heater other than the heater for heating the sample, and a nitrogen gas is flowed as a carrier gas at a rate of 5 l/min. It is confirmed that the single phase of $FeS_2$ pyrite is formed by carrying out an XRD measurement after the sulfide treatment. The thickness of the iron sulfide layer 1032 was measured by means of a level-difference thickness meter, and the thickness was 700 nm. The iron sulfide semiconductor shown in FIG. 14 is thus manufactured.

The conductive type shown in FIG. 15 is determined on the basis of the result of Hall measurement. The Hall measurement conditions are as follows. Al was used as an electrode material, and the van der Pauw method was used for the electrode structure. The measurement was carried out by means of RESITEST8300 of a product of TOYO Corporation on the conditions of a magnetic field maximum amplitude of 0.6 T and a magnetic field frequency of 0.1 Hz at a room temperature in a dry nitrogen atmosphere. Moreover, the Zn/Fe ratios shown in FIG. 15 are determined on the basis of the result of Auger electron spectroscopy measurement. Moreover, Eg (eV) is determined on the basis of optical bandgap (Eg) measurement.

In this case, Eg was calculated by obtaining an optical absorption coefficient α from the optical transmittance and reflectance measurements and plotting the second power ($\omega^2\alpha^2$) of the optical absorption coefficient with respect to the energy of incident light on the basis of the x-segment of a straight line obtained by the least squares method from an appropriate range of the plot. That is, a direct transition bandgap was obtained from the x-segment.

Moreover, the concentration (mmol/l) shown in FIG. 15 represents the concentration of zinc chloride ($ZnCl_2$) used for producing a solution for spraying.

As shown in FIG. 15, the carrier type was the p-type in any of the comparative example 102 in which Zn is not contained and the examples 113 through 118 in which Zn is contained. Moreover, if the examples 113 through 118 are compared with one another, Eg steeply increases as the Zn concentration increases up to 30% of the Zn/Fe ratio and subsequently exhibits a tendency of saturation. Therefore, the forbidden bandwidth can be accurately controlled by making iron sulfide contain Zn.

A doped semiconductor layer is described next.

The sulfide semiconductor of the examples 119 and 120 of the present invention is a doped semiconductor layer. The sulfide semiconductors of the examples 118 and 120 have a schematic sectional view shown in FIG. 14 as in the examples 113 through 118.

FIG. 16 described below is a table showing the kinds and concentrations of the compounds used for manufacturing the sulfide semiconductors of the examples 119 and 120 of the present invention and the sulfide semiconductor of the comparative example 102.

The semiconductor layers of the examples 119 and 120 and the comparative example 102 are described below on the basis of FIGS. 14 and 16.

The iron sulfide semiconductor of the examples 119 and 120 is manufactured by forming an iron sulfide layer 1132 on a glass substrate 1131 having a thickness of 1.1 mm using the spray pyrolysis method and the sulfurization method together.

In detail, solutions for spraying are produced by further dissolving compounds (NaCl in the case of the p-type and $AlCl_3$ in the case of the n-type) containing impurities for control to the conductive types shown in FIG. 16 in the solution for spraying used in the example 116. Next, the glass substrate 1131 is heated to a temperature of about 200° C. on a hot plate in the atmosphere, and thereafter, a thin film is formed by spray coating of the solution on the hot plate.

It is confirmed that the peaks of oxide and hydroxide of iron are not observed by subjecting the thin film obtained by spray coating to an XRD measurement. From this fact, it is confirmed that the principal ingredient of the thin film is FeS.

Next, a sample in which a thin film is formed on the glass substrate 1131 is baked for one hour at a temperature of 500° C. in a sulfur vapor atmosphere. At this time, a sulfur vapor is generated by heating sulfur at a temperature of 150° C. by means of a heater other than the heater for heating the sample, and a nitrogen gas is flowed as a carrier gas at a rate of 5 l/min. It is confirmed that the single phase of $FeS_2$ pyrite is formed by carrying out an XRD measurement after the sulfide treatment. The thickness of the iron sulfide layer 1132 was measured by means of a level-difference thickness meter, and the thickness was 700 nm. The iron sulfide semiconductor shown in FIG. 14 is thus manufactured.

The conductive types and the carrier densities shown in FIG. 16 are determined on the basis of the result of Hall measurement. The Hall measurement conditions are as follows. Al was used as an electrode material, and the van der Pauw method was used for the electrode structure. The measurement was carried out by means of RESITEST8300 of a product of TOYO Corporation on the conditions of a magnetic field maximum amplitude of 0.6 T and a magnetic field frequency of 0.1 Hz at a room temperature in a dry nitrogen atmosphere. Moreover, the intra-film element concentrations (Na concentration in the case of the p-type and Al concentration in the case of the n-type) shown in FIG. 16 are determined on the basis of the result of Auger electron spectroscopy measurement.

As shown in FIG. 16, the carrier type was the p-type and the carrier density was $1\times10^{17}$ cm$^{-3}$ in the comparative example 102 that has not undergone doping. Moreover, the carrier type was the p-type and the carrier density was $1\times10^{19}$ cm$^{-3}$ in the example 119 in which Na was contained.

From this fact, the hole carrier density can be increased when Na is contained in iron sulfide containing Zn. Moreover, the carrier type was the n-type and the carrier density was $8\times10^{18}$ cm$^{-3}$ in the example 120 in which Al is contained. From this fact, the electron carrier density can be increased when Al is contained in iron sulfide containing Zn. As described above, the forbidden bandwidth, the carrier type and the carrier density of the iron sulfide semiconductor can be independently controlled, and a semiconductor layer suitable for application can be obtained.

The photoelectric converter is described next.

The photoelectric converter devices of examples 121 through 124 of the present invention have a sectional view shown in FIG. 13. FIG. 17 is a table showing the kinds of the n-type semiconductor layers owned by the photoelectric converters of the examples 121 through 124 and the photoelectric conversion efficiencies of the photoelectric converters employing the layers.

The photoelectric converters of the examples 121 through 124 are described below on the basis of FIGS. 13 and 17.

The photoelectric converters of the examples 121 through 124 each have a substrate 1121, a first electrode layer 1122 formed in a surface region of at least part of the substrate 1121, a photoelectric conversion layer 1123 formed on the first electrode layer 1122, a transparent electrode layer 1124 formed on the photoelectric conversion layer 1123 and a grid electrode layer 1125 formed in a surface region of at least part of the transparent electrode layer 1124.

The photoelectric conversion layer 1123 is constituted of a p-type semiconductor layer 1127 formed on the first electrode layer 1122 and an n-type semiconductor layer 1128 formed on the p-type semiconductor layer 1127. In this case, the photoelectric converters of the examples 121 through 124 are similar except for the point that the materials and manufacturing methods of the n-type semiconductor layer 1128 are different.

The photoelectric converter of the example 121 is formed as follows.

First of all, a Pt film having a thickness of 500 nm is formed by the vacuum evaporation method on the glass substrate 1121 that has a plate thickness of, for example, 1.1 mm, and the first electrode layer 1122 is formed by depositing n-type gallium-doped zinc oxide (ZnO:Ga) by 700 nm on it by the magnetron sputtering method. Next, a p-type semiconductor layer 1127 constituted of FeS$_2$ pyrite containing Zn is formed on the first electrode layer 1122 by using the spray pyrolysis method and the sulfurization method together. In detail, in forming the p-type FeS$_2$ pyrite containing Zn, the same solution as that of the example 115 of FIG. 15 is used as a spray solution for the p-type. A thin film is formed by heating the glass substrate 1121, on which the first electrode layer 1122 has been layered, to a temperature of about 200° C. on a hot plate in the atmosphere and spray coating of the solution on it.

Next, the processed resultant is baked at a temperature of 500° C. in a sulfur vapor atmosphere. At this time, a sulfur vapor is generated by heating sulfur at a temperature of 150° C. by means of a heater other than the heater for heating the sample, and a nitrogen gas is flowed as a carrier gas at a rate of 5 l/min. In this case, it is confirmed that the single phase of FeS$_2$ pyrite is formed by carrying out an XRD measurement after the sulfide treatment. In one experimental example, the film thickness of the FeS$_2$ pyrite film was 2 μm. The layers up to the p-type semiconductor layer 1027 are thus formed.

Subsequently, spray coating is carried out again to produce n-type FeS$_2$ pyrite on p-type FeS$_2$ pyrite. In detail, in producing the n-type FeS$_2$ pyrite containing Mg and Al, a solution obtained by diluting twentyfold the same solution as that of the example 120 of FIG. 15 is used as a spray solution for the n-type. A thin film is formed by heating the substrate, on which the p-type FeS$_2$ pyrite has been formed, to a temperature of about 100° C. on the hot plate in the atmosphere and spray coating of the solution on it. At this time, the frequency of spraying is adjusted so that the film thickness becomes 50 nm, and thereafter, baking is carried out at a temperature of 500° C. in a sulfur vapor atmosphere as in the case of the p-type. In this case, baking time was set to ten minutes. The photoelectric conversion layer 1123 constituted of the p-type semiconductor layer 1127 formed on the electrode layer 1122 and the n-type semiconductor layer 1128 formed on the p-type semiconductor layer 1127 is thus formed. In this case, the forbidden bandwidth of the p-type semiconductor layer 1127 is obviously equal to that of the example 115 because of the spray solution used for the manufacturing. The forbidden bandwidth of the n-type semiconductor layer 1128 was 1.29 eV as the result of producing the FeS$_2$ pyrite on the glass substrate in a manner similar to the method described above and measuring the forbidden bandwidth as in the examples 113 through 118. From this fact, the relation: Eg1<Eg2 was able to be satisfied.

Subsequently, the transparent conductive film 1124 is formed by depositing n-type gallium-doped zinc oxide (ZnO:Ga) by 700 nm on the photoelectric conversion layer 1123 by the magnetron sputtering method, and thereafter, the grid electrode layer 1125 is formed by forming a comb-like shape of silver (Ag) on the transparent conductive film 1124 by the magnetron sputtering method. The photoelectric converter shown in FIG. 13 is thus formed.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. Then, the results shown in FIG. 17 were obtained.

Next, the photoelectric converter of the example 122 is formed as follows. The layers up to the p-type semiconductor layer 1127 are formed as in the example 121. Subsequently, spray coating is carried out again to produce n-type FeS$_2$ pyrite on p-type FeS$_2$ pyrite. In detail, in producing an n-type FeS$_2$ pyrite containing Zn and Al, the photoelectric converter shown in FIG. 13 is formed by using a solution obtained by adding AlCl$_3$ to the same solution as that of the example 113 of FIG. 15 so that AlCl$_3$ comes to have a concentration of 100 mmol/l and thereafter diluting twentyfold the resulting solution with pure water as a spray solution for the n-type with the subsequent steps made similar to those of the example 121. In this case, the forbidden bandwidth of the p-type semiconductor layer 1127 in the example 122 is obviously equal to that of the example 115 because of the spray solution used for the manufacturing. The forbidden bandwidth of the n-type semiconductor layer 1128 was 1.10 eV as the result of producing $FeS_2$ pyrite on a glass substrate in a manner similar to the method described above and measuring the forbidden bandwidth as in the examples 113 through 118. Therefore, the relation: Eg1>Eg2 holds.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 17.

Next, the photoelectric converter of the example 123 is formed as follows. The layers up to the p-type semiconductor layer 1127 are formed as in the example 121.

Subsequently, spray coating is carried out again to produce n-type $FeS_2$ pyrite on p-type $FeS_2$ pyrite. In detail, in producing n-type $FeS_2$ pyrite containing Zn and Al, the photoelectric converter shown in FIG. 13 is formed by using a solution obtained by adding $AlCl_3$ to the same solution as that of the example 113 of FIG. 15 so that $AlCl_3$ comes to have a concentration of 0.5 mmol/l and thereafter diluting twentyfold the resulting solution with pure water as a spray solution for the n-type with the subsequent steps made similar to those of the example 121. In this case, the forbidden bandwidth of the p-type semiconductor layer 1127 in the example 122 is obviously equal to that of the example 115 because of the spray solution used for the manufacturing. The forbidden bandwidth of the n-type semiconductor layer 1128 was 1.00 eV as the result of producing $FeS_2$ pyrite on a glass substrate in a manner similar to the method described above and carrying out measurement of the forbidden bandwidth as in the examples 113 through 118. From this fact, the relation: Eg1>Eg2 holds.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 17.

Next, the photoelectric converter of the example 123 is formed as follows. First of all, the layers up to the p-type semiconductor layer 1127 are formed as in the example 121. Subsequently, spray coating is carried out again to produce n-type $FeS_2$ pyrite on p-type $FeS_2$ pyrite. In detail, in producing the n-type $FeS_2$ pyrite containing Zn and Al, the photoelectric converter shown in FIG. 13 is formed by using a solution obtained by adding $AlCl_3$ to the same solution as that of the example 113 of FIG. 15 so that $AlCl_3$ comes to have a concentration of 0.5 mmol/l and thereafter diluting twentyfold the resulting solution with pure water as a spray solution for the n-type with the subsequent steps made similar to those of the example 121. In this case, the forbidden bandwidth of the p-type semiconductor layer 1127 in the example 122 is obviously equal to that of the example 115 because of the spray solution used for the manufacturing. The forbidden bandwidth of the n-type semiconductor layer 1128 was 0.97 eV as the result of producing $FeS_2$ pyrite on a glass substrate in a manner similar to the method described above and carrying out measurement of the forbidden bandwidth as in the examples 113 through 118. From this fact, the relation: Eg1>Eg2 holds.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 17.

Next, the photoelectric converter of the example 124 is formed as follows. First of all, layers up to the p-type semiconductor layer 1127 are formed as in the example 121. Subsequently, spray coating is carried out again to produce n-type ZnO on p-type $FeS_2$ pyrite. In detail, in producing n-type ZnO having oxygen deficiency, a solution is produced as a spray solution for the n-type by incorporating zinc chloride ($ZnCl_2$) into 500 ml of pure water so that zinc chloride ($ZnCl_2$) has a concentration of 5 mmol/l and used as a solution for spraying. Next, a thin film is formed by heating the substrate, on which the p-type $FeS_2$ pyrite has been formed, to a temperature of about 100° C. on a hot plate in the atmosphere and spray coating of the solution on it. At this time, the frequency of spraying is adjusted so that the film thickness becomes 200 nm, and thereafter, the processed resultant is heated to a temperature of about 200° C. on the hot plate in the atmosphere and dried and oxidized for ten minutes. Then, the photoelectric conversion layer 1123 constituted of the p-type semiconductor layer 1127 formed on the electrode layer 1122 and the n-type semiconductor layer 1128 formed on the p-type semiconductor layer 1127 is formed. In this case, n-type ZnO is produced on a glass substrate as in the method described above, and the resistivity and the forbidden bandwidth were measured. The resistivity was $2 \times 10^{-9}$ Ωcm as the result of measurement after the layering of a comb-type Ag electrode. The forbidden bandwidth was 3.4 eV as the result of obtainment by a method similar to that in the case of iron sulfide. Therefore, the relation: Eg1<Eg2 is satisfied.

Subsequently, the transparent conductive film 1124 is formed by depositing n-type gallium-doped zinc oxide (ZnO:Ga) by 700 nm on the photoelectric conversion layer 1123 by the magnetron sputtering method, and thereafter, the grid electrode 1125 is formed by forming a comb-like shape of silver (Ag) on the transparent conductive film 1124 by the magnetron sputtering method. The photoelectric converter shown in FIG. 13 is thus formed.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion characteristics were measured under the conditions of a cell temperature of 25° C. and a cell area of 1 cm$^2$. The measurement results of the photoelectric conversion efficiencies are shown in FIG. 17.

As shown in FIG. 17, all of the photoelectric converters of the examples 121 through 124 exhibited a rectification property, and the conversion efficiency of each photoelectric converter had a high value exceeding 2%. From this fact, a satisfactory pn junction can be provided when an iron sulfide semiconductor containing iron sulfide and Zn.

Moreover, if the examples 122 and 123 in which the relation: Eg1>Eg2 holds between the forbidden bandwidth Eg1 of the p-type semiconductor and the forbidden bandwidth Eg2 of the n-type semiconductor is compared with the examples 109 and 124 in which Eg1<Eg2, the latter has a higher photoelectric conversion efficiency. Therefore, higher photoelectric conversion efficiency can be provided when the forbidden bandwidth has the relation: Eg1<Eg2.

Moreover, if the example 123 in which the n-type $FeS_2$ pyrite semiconductor layer containing no Zn is employed is compared with the examples 121 and 122 in which the n-type FeS2 pyrite semiconductor layer containing Zn is employed, the latter has a higher photoelectric conversion efficiency. Therefore, when the n-type semiconductor layer contains Zn, a satisfactory rectification characteristic can be obtained, and a higher photoelectric conversion efficiency be provided.

Moreover, the example 124 in which the n-type semiconductor layer contains an oxide of Zn has higher photoelectric conversion efficiency in comparison with the examples 121 through 123 in which the n-type semiconductor layer contains no oxide of Zn. Therefore, higher photoelectric conversion efficiency can be obtained when the n-type semiconductor layer contains the oxide of Zn.

Although the photoelectric converter was manufactured by employing the pn junction constituted of the p-type semiconductor and the n-type semiconductor of the present invention in the examples 121 through 124, it is, of course, acceptable to manufacture pn junction devices such as diodes, transistors (pnp transistor, npn transistor and pnip transistor) and switches (pnpm switch and pnpn switch) having a pn junction device by employing the pn junction constituted of the p-type semiconductor and the n-type semiconductor of the present invention. If a pn junction device is produced by employing the pn junction constituted of the p-type semiconductor and the n-type semiconductor of the present invention, the rectification characteristic of the pn junction device can be remarkably improved, and the device characteristics of the pn junction device can be remarkably improved.

Figure 18:
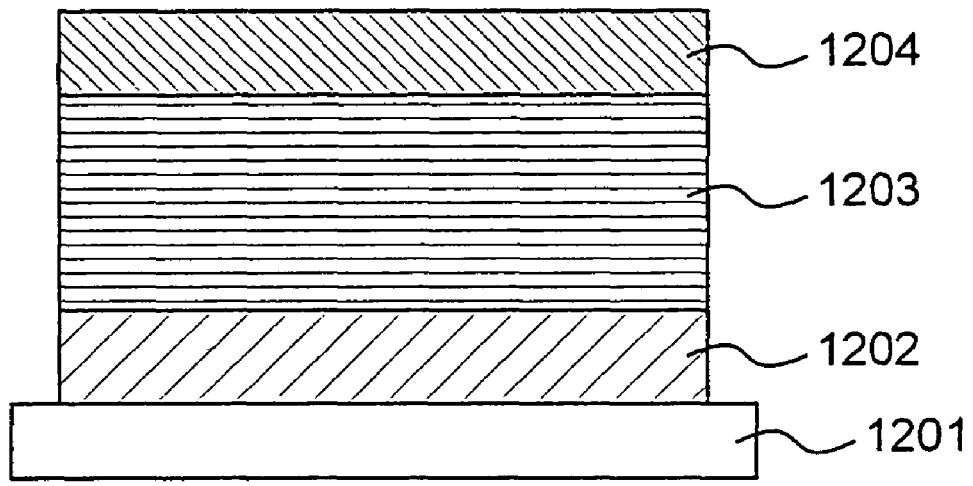
FIG. 18 is a schematic sectional view of the photoelectric converter of one embodiment of the present invention.

FIG. 18 is a sectional view of the photoelectric converter of one embodiment of the present invention.

The photoelectric converter has a substrate 1201, a first electrode layer 1202 formed on a surface region of at least part of the substrate 1201, a photoelectric conversion layer 1203 formed on the first electrode layer 1202 and a second electrode layer 1204 formed on the photoelectric conversion layer 1203.

It makes no matter whether or not the substrate 1201 has translucency when the substrate 1201 is located on the side opposite from the light incidence side, while at least part of the substrate 1201 should preferably have translucency when the substrate 1201 is located on the light incidence side. As a material of the translucent substrate, there are glass, translucent resins of a polyimide system, a polyvinyl system or a polysulfide system having a certain heat resistance, a laminate of the materials and so on. As a material of a non-translucent substrate, there are stainless steel, non-translucent resins and so on.

Moreover, undulations may be formed on the surface of the substrate 1201, and in this case, various effects of optical confinement, antireflection and so on can be obtained by the refraction, scattering and so on of light on the undulated surface. Moreover, it is acceptable to provide a coating of a metal film, a semiconductor film, an insulator, a composite film of the materials or the like on the surface of the substrate 1201. The thickness of the substrate 1201 is not specifically limited but required to have appropriate strength and weight capable of supporting the structure, and a thickness of 0.1 mm to 40 mm can be adopted as the thickness of the substrate 1201.

The form of the electrode layer 1202 may have any form so long as it is substantially put in ohmic contact with the photoelectric conversion layer 1203, but the layer should preferably be formed in a film shape on the substrate 1201. The material used for the first electrode layer 1202 is not specifically limited so long as it has conductivity. However, it is preferable to use a metal material of Mo, Al, Pt, Ti, Fe or the like, an alloy of the material or a transparent conductive electrode material represented by fluorine-doped tin oxide ($SnO_2$:F), antimony-doped tin oxide ($SnO_2$:Sb), tin-doped indium oxide ($In_2O_3$:Sn), Al-doped zinc oxide (ZnO:Al), Ga-doped zinc oxide (ZnO:Ga), B-doped zinc oxide (ZnO:B) and the like. Moreover, the first electrode layer 1202 may be a monolayer film of any of the materials described above or a laminate film in which a plurality of layers of the materials are layered.

When the first electrode layer 1202 is located on the light incidence side, the first electrode layer 1202 should preferably have a high translucency in an optical wavelength region that contributes to photoelectric conversion. The first electrode layer 1202 is formed by layering the component that becomes the material on the substrate 1201 by a gas phase method such as vacuum evaporation method, sputtering method, CVD method and PVD method, sol-gel method, CBD (chemical bus deposition) method, spraying method, screen printing method and the like.

As described above, when the substrate 1201 is located on the light incidence side, the first electrode layer 1202 is required to have a high optical translucency. Therefore, the first electrode layer 1202 should preferably be formed of a metal electrode having a grid shape such as a comb-like shape of which the surface is not uniformly covered, a transparent conductive layer of a high optical translucency or by combining those requirements.

The first electrode layer 1202 should preferably have undulations on the surface thereof. The undulations existing on the surface of the first electrode layer 1202 refract and scatter light that has entered the inside of the photoelectric converter at an interface located between the first electrode layer 1202 and the photoelectric conversion layer 1203 formed on it. As a result, the optical path length of the incident light can be made long to allow the light confining effect to be improved, and the quantity of light that can be utilized in the photoelectric conversion layer 1203 can be increased. As a method for forming the undulations, a dry etching method, a wet etching method, mechanical processing like sand blasting or the like on the surface of the first electrode layer 1202 can be used.

As the dry etching method, there is chemical etching using a fluorine based gas such as $CF_4$ or $SF_6$, a chlorine based gas such as $CCl_4$ or $SiCl_4$, methane gas or the like besides physical etching using an inert gas such as Ar. As the wet etching method, there is a method for immersing the first electrode layer 1202 in an acid or alkaline solution or the like. In this case, there are mixtures of one kind or two or more kinds of hydrochloric acid, sulfuric acid, nitric acid, hydrofluoric acid, acetic acid, formic acid, perchloric acid and the like as usable acid solutions. There are mixtures of one kind or two or more kinds of sodium hydroxide, ammonia, potassium hydroxide, calcium hydroxide, aluminum hydroxide and the like as alkaline solutions. As methods other than the etching method described above, there are a method for self-forming surface undulations by controlling the crystal growth of the material itself of the first electrode layer 1202 by the CVD method or the like and a method for forming surface undulations depending on the crystal grain shape by the sol-gel method or the spraying method.

The photoelectric conversion layer 1203 is formed on the first electrode layer 1202 substantially in mutual ohmic contact. The photoelectric conversion layer 1203 has a structure including a p-type semiconductor layer in which a group Ia element is added to iron sulfide. The structure of the photoelectric conversion layer 1203 is provided by a structure that includes a pn junction having a p-type semiconductor layer and an n-type semiconductor layer, a structure that includes a p+-p-n layer having a $p^+$-type semiconductor layer, a structure that includes a pin junction having a p-type semiconductor layer, an intrinsic (i-type) semiconductor layer and an n-type semiconductor layer, a Schottky junction that includes only a p-type semiconductor layer, a structure that includes a semiconductor junction such as a MIS structure or the like. It is noted that the i-type semiconductor layer may exhibit a weak p-type or weak n-type conductive type so long as the photoelectric conversion function is not impaired.

Moreover, the $p^+$ type semiconductor layer is only required to have a relatively greater amount of hole carrier density than in the p-type semiconductor layer, and the hole carrier density of the $p^+$-type semiconductor layer should preferably be about 20 times that of the p-type semiconductor layer. Moreover, the photoelectric converter may have a structure in which two or more photoelectric conversion layers are layered, and the photoelectric converter may be a so-called laminate type photoelectric converter.

If a group Ia element is added to iron sulfide, a quality p-conductive type semiconductor layer excellent in reproducibility can be obtained. This is presumably ascribed to the following reasons. That is, it is presumed that the group Ia element exists in the crystal lattice of iron sulfide because of the fact that any impurity crystal phase other than the diffraction pattern of iron sulfide has not been observed as the result of the X-ray diffraction measurement and the fact that a peak shift has been observed in the diffraction pattern of iron sulfide. From this fact, for example, when a monovalent group Ia element has substituted into a bivalent iron site, the group Ia element becomes an acceptor, and a p-conductive type semiconductor layer is formed. Moreover, when the iron sulfide contains a group Ia element, the defect density in the iron sulfide can be reduced. This can be evaluated by a photoluminescence measurement. During the measurement, nonradiative recombination with no light emission and light emission corresponding to the defect level occur when a recombination process through the defect or the like exists, and the photoluminescence peak intensity corresponding to the interband transition is lowered. From this fact, the defect density is lowered as the photoluminescence peak intensity corresponding to the interband transition is increased.

In this case, since the photoluminescence peak intensity corresponding to the interband transition is increased when iron sulfide contains a group Ia element in comparison with the case where iron sulfide contains no group Ia element, it is considered that the defect density is reduced. It is noted that the ion radius of Li, Na and K has a comparatively small difference to that of $Fe^{2+}$ among the group Ia elements. When iron sulfide contains at least one of Li, Na and K, the generation of the impurity crystal phase can be suppressed, and this is preferable.

The present inventor experimentally discovered that the concentration should preferably be $4\times10^{15}$ cm$^{-3}$ to $2\times10^{20}$ cm$^{-3}$ when the group Ia element is Na. The kind and the concentration of the group Ia element in iron sulfide were evaluated by the well-known element analysis method of secondary ion mass spectrometry (SIMS), Auger electron spectroscopy and the like.

Moreover, it was ascertained that a semiconductor characteristic suitable for application was obtained when iron sulfide contained $FeS_2$ of a pyrite type crystal structure. The pyrite type $FeS_2$, which has a high optical absorption coefficient (not greater than $10^5$ cm$^{-1}$) with respect to visible light, is therefore useful as a solar cell material. Moreover, pyrite type $FeS_2$, which has a bandgap close to a wavelength of not greater than 1.55 μm (photon energy of not greater than 0.85 eV) of the lowest loss among optical fibers, is therefore useful as a material of a light receiving and emitting device for optical communications. Therefore, if iron sulfide has $FeS_2$ of the pyrite type crystal structure, the characteristic of iron sulfide can be brought close to a characteristic useful for the application, and this is preferable. Moreover, if iron sulfide contains a great amount of $FeS_2$ of the pyrite type crystal structure, a comparatively high carrier mobility (up to 100 cm$^2$/Vs) can be achieved even in the case of a polycrystal. Therefore, the semiconductor characteristics can be remarkably improved when the substance is used as a material for an inexpensive transistor.

As a manufacturing method of the photoelectric conversion layer 1203, the well-known manufacturing methods such as MBE method, CVD method, vapor deposition method, close-spaced sublimation method, sputtering method, sol-gel method, spraying method, CBD (chemical bus deposition) method, screen printing method and the like can be used. Moreover, atmospheric pressure CVD, low-pressure CVD, plasma CVD, thermal CVD, hot-wire CVD, MOCVD and the like can be enumerated as the CVD method. Details of the manufacturing method are as described in detail in, for example, Altermatt et al. or the cited documents described in it.

In this case, sulfide treatment in a sulfur vapor or a hydrogen sulfide atmosphere should preferably be carried out at need. A sulfide treatment temperature of 200° C. to 600° C. is preferable. If the sulfide treatment is carried out, it is allowed to promote the crystallization of the amorphous component, increase the percentage content of sulfur in iron sulfide and increase the ratio of $FeS_2$ of the pyrite type crystal structure.

In this case, the ratio of the amorphous component can be estimated by carrying out an XRD measurement. In detail, the estimation can be made by comparing the peak intensity of the XRD measurement in the layer in which the crystal component is to be detected with the peak intensity of the layer that has the same film thickness as that of the layer in which the crystal component is to be detected and has undergone sufficient crystallization. Moreover, the ratio of $FeS_2$ having the pyrite type crystal structure can be estimated by comparing the XRD peak intensity of $FeS_2$ of the pyrite structure with the XRD peak intensity of iron sulfide of the other structures.

Finally, the essential part of the photoelectric converter is completed by forming the second electrode layer 1204 on the photoelectric conversion layer 1203. In detail, the essential part of the photoelectric converter is formed by forming the second electrode layer 1204 on the photoelectric conversion layer 1203 substantially in mutual ohmic contact by using a material and a manufacturing method similar to those of the electrode layer 1202.

Figure 19:
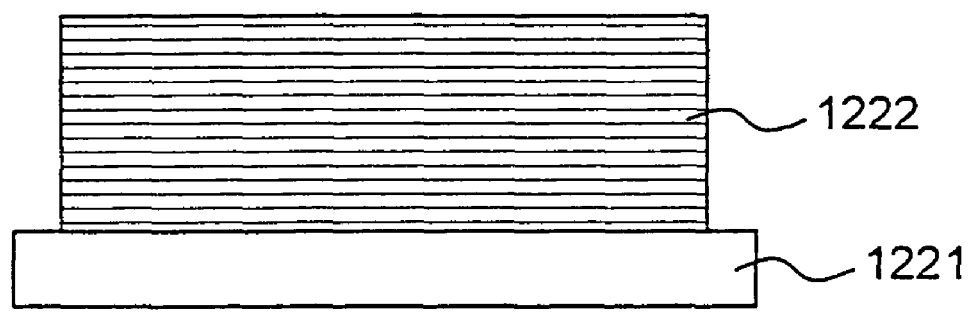
FIG. 19 is a schematic sectional view of the semiconductor of one embodiment of the present invention.

FIG. 19 is a schematic sectional view of the sulfide semiconductor of the examples 125 through 132 of the present invention and a comparative example 103. FIG. 20 described below is a table showing the kinds and concentrations of the compounds used for manufacturing the sulfide semiconductors of the examples 125 through 132 of the present invention and the comparative example 103.

The p-type semiconductor layer of the examples 125 through 132 is described below on the basis of FIGS. 19 and 20.

The sulfide semiconductors of the examples 125 through 132 are each manufactured by forming an iron sulfide layer 1222 on a glass substrate 1221 having a thickness of 1.1 mm using the spray pyrolysis method and the sulfurization method together.

In detail, a solution in which the concentration of iron chloride ($FeCl_2$) is 0.05 mol/l and the concentration of thiourea ($NH_2CSNH_2$) is 0.1 mol/l is produced by incorporating iron chloride ($FeCl_2$) and thiourea ($NH_2CSNH_2$) into, for example, 500 ml of pure water.

Next, solutions for spraying are formed by further dissolving compounds containing doping elements of which the kinds and concentrations of the compounds are shown in FIG. 20 in the produced solution. In this case, when the solute is not easily dissolved, the solute can easily be dissolved by adding hydrochloric acid. It is noted that hydrochloric acid is not added in the examples 125 through 131 and the comparative example 103.

Next, the glass substrate 1221 is heated to a temperature of about 300° C. on a hot plate in the atmosphere, and thereafter, a thin film is formed by spray coating of the solutions, of which the details are shown in FIG. 20, on the hot plate. The peaks of oxide and hydroxide of iron were not observed as the result of subjecting the thin film formed by spray coating to an XRD measurement. From this fact, it was confirmed that the principal ingredient of the thin film was FeS.

Next, the processed resultant is baked for one hour at a temperature of 500° C. in a sulfur vapor atmosphere. At this time, a sulfur vapor is generated by heating sulfur at a temperature of lower than 200° C. by means of a heater other than the heater for heating the sample, and a nitrogen gas is flowed as a carrier gas at a rate of 5 l/min. It is confirmed that the single phase of $FeS_2$ pyrite is formed by carrying out an XRD measurement after the sulfide treatment. Moreover, in one experimental example, the thickness of the iron sulfide layer 1222 was measured by means of a level-difference thickness meter, and the thickness was 700 nm. The iron sulfide semiconductor shown in FIG. 19 is thus manufactured.

In FIG. 20, the conductive type and the carrier density are the results of a Hall measurement. The Hall measurement conditions are as follows. Al was used as an electrode material, and the van der Pauw method was used for the electrode structure. The measurement was carried out by means of RESITEST8300 of a product of TOYO Corporation on the conditions of a magnetic field maximum amplitude of 0.6 T and a magnetic field frequency of 0.1 Hz at a room temperature in a dry nitrogen atmosphere. Moreover, in FIG. 20, a group Ia element concentration was measured by SIMS measurement in the examples 125 through 128, 131 and 132 and measured by Auger electron spectroscopy in the examples 129 and 130. Moreover, in FIG. 20, a PL emission intensity was measured by photoluminescence measurement. The PL emission intensity was expressed by relative emission intensity in the case where the photoluminescence peak intensity corresponding to the interband transition of the comparative example 103 was assumed as one. The photoluminescence measurement was carried out at the room temperature by using an Ar-ion laser of a 100-mW output (514.5-nm wavelength) as an excitation light and using an InGaAs detector as a detector. In the sample of weak photoluminescence intensity, it is preferable to carry out measurement at a low temperature by using liquid nitrogen or liquid helium.

As shown in FIG. 20, the carrier type was the p-type in the comparative example 103 in which no doping was carried out, and the carrier density was on the order of $10^{16}$. Moreover, the carrier type was the p-type in each of the examples 125 through 132 in which the doping with the group Ia element was carried out. Moreover, a high PL emission intensity was exhibited in each of the examples 125 through 132 in which the doping with the group Ia element was carried out and the defect density is reduced in comparison with the comparative example 103. From this fact, a quality p-type iron sulfide semiconductor can be formed when the iron sulfide semiconductor contains a group Ia element.

Moreover, in the examples 125 through 130, the concentration of the group Ia element is different while the kind of the group Ia element is equal. If the examples 125 through 130 are compared with one another, the hole carrier density increases as the Na concentration increases. However, in the examples 125 and 126, the carrier density is reduced in comparison with the comparative example 103 although the doping with the group Ia element that is considered to become an acceptor is carried out. Although the reason for this is not clear, it is considered that the group Ia element passivates the Fe-deficient site. That is, it is considered that an atomic deficiency acts as an acceptor in the comparative example 103, and it is considered that the carrier density is reduced since only one hole can be supplied when the monovalent group Ia element covers the deficiency in contrast to the fact that two holes can be supplied when bivalent Fe becomes deficient.

Moreover, if the comparative example 103 is compared with the examples 125 through 130, the PL emission intensity gradually increases with an increase in the amount of group Ia elements as shown in the examples 125 through 128. Further, when the group Ia element concentration is increased, the PL emission intensity is reduced as shown in the examples 128 through 130. In view of the change in the PL emission intensity, a quality p-type semiconductor of a low defect density can be obtained when the number density of the group Ia elements contained in iron sulfide is within a range of $4\times10^{15}$ $cm^{-3}$ to $2\times10^{20}$ $cm^{-3}$.

Therefore, when the concentration of the group Ia element contained in iron sulfide is within the range of $4\times10^{15}$ $cm^{-3}$ to $2\times10^{20}$ $cm^{-3}$, the conductive type of the iron sulfide semiconductor can be formed into the p-type, and a quality p-type semiconductor in which the defect density is reduced can be formed concurrently with the achievement of a carrier density corresponding to the doping rate of the group Ia element.

If a semiconductor junction device such as a diode, a transistor or a semiconductor laser device is formed by employing the p-type semiconductor of the present invention, the characteristics of the electronic conductivity and so on of the p-type semiconductor of the semiconductor junction device can be improved, and therefore, the device characteristics of the semiconductor junction device can be remarkably improved.

Figure 21:
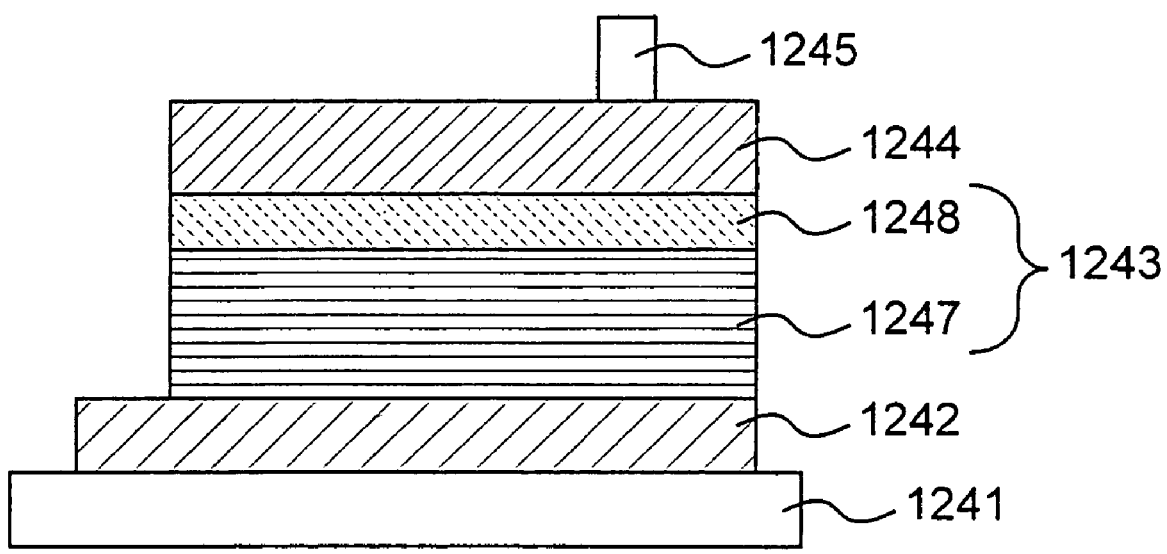
FIG. 21 is a schematic sectional view of the photoelectric converter of one embodiment of the present invention.

FIG. 21 is a sectional view of the photoelectric converter of the examples 133 through 144 of the present invention. FIG. 22 is a table showing the kinds of spray solutions used for manufacturing the photoelectric converters of the examples 133 through 144 of the present invention.

The photoelectric converters of the examples 133 through 144 are described below on the basis of FIGS. 21 and 22.

The photoelectric converters of the examples 133 through 144 are each formed as follows. First of all, a Pt film having a thickness of 500 nm is formed on a glass substrate 1241 that has a film thickness of, for example, 1.1 mm by the vacuum evaporation method. An electrode layer 1242 is thus formed on the glass substrate 1241. Next, a photoelectric conversion layer 1243 having a pn junction of $FeS_2$ pyrite is formed on the electrode layer 1242 by using the spray pyrolysis method and the sulfurization method together. Subsequently, a transparent conductive film 1244 is formed on the photoelectric conversion layer 1243, and thereafter, a grid electrode 1245 is formed on the transparent conductive film 1244, forming a photoelectric converter.

In detail, the same spray solution for the p-type as that of the examples 125 through 132 of FIG. 20 is used in forming the p-type $FeS_2$ pyrite as shown in FIG. 22. The glass substrate 1241, on which the electrode layer 1242 has been layered, is heated to a temperature of about 300° C. on a hot plate in the atmosphere, and a thin film is formed by spray coating of the solution on it. It is confirmed that the peaks of oxide and hydroxide of iron are not observed by subjecting the spray coated thin film to an XRD measurement and it is FeS.

Next, the processed resultant is baked at a temperature of 500° C. for one hour in a sulfur vapor atmosphere. At this time, a sulfur vapor is generated by heating sulfur at a temperature of lower than 200° C. by means of a heater other than the heater for heating the samples, and a nitrogen gas is flowed as a carrier gas at a rate of 5 l/min. It is confirmed that the single phase of $FeS_2$ pyrite is formed by carrying out an XRD measurement after the sulfide treatment. The thickness was 2 μm in one experimental example.

Subsequently, spray coating is carried out again to produce n-type $FeS_2$ pyrite on p-type $FeS_2$ pyrite. By incorporating iron chloride ($FeCl_2$) and thiourea ($NH_2CSNH_2$) into 500 ml of pure water, a solution in which the connection of iron chloride ($FeCl_2$) is 2.5 mmol/l and the concentration of thiourea ($NH_2CSNH_2$) is 5 mmol/l is produced. Then, solutions for spraying are formed by further dissolving compounds containing doping elements of which the kinds and concentrations of the compounds are shown in FIG. 3 in the produced solution. When the solute is not easily dissolved, the solute can be easily dissolved by adding hydrochloric acid. Only in the example 142, hydroxide gallium ($Ga_2O_3.nH_2O$) was dissolved by adding 0.15 ml of 35% hydrochloric acid.

The substrate, on which the p-type $FeS_2$ pyrite has been formed, is heated to a temperature of about 200° C. on a hot plate in the atmosphere, and a thin film is formed by spray coating of the solution on it. At this time, the frequency of spraying is adjusted so that the film thickness becomes 50 nm, and thereafter, baking is carried out at a temperature of 500° C. in a sulfur vapor atmosphere as in the case of the p-type. In this case, the baking time was set to ten minutes. The photoelectric conversion layer 1243 constituted of the p-type semiconductor layer 1247 formed on the electrode layer 1242 and the n-type semiconductor layer 1248 formed on the p-type semiconductor layer 1247 is thus formed.

Subsequently, the transparent conductive film 1244 is formed by depositing n-type gallium-doped zinc oxide (ZnO: Ga) by 700 nm on the photoelectric conversion layer 1243 by the magnetron sputtering method, and thereafter, the grid electrode 1245 is formed by forming a comb-like shape of silver (Ag) on the transparent conductive film 1244 by the magnetron sputtering method. The photoelectric converter shown in FIG. 21 is thus formed.

The present inventor investigated the photoelectric conversion efficiencies of the thus-manufactured photoelectric converters. In concrete, light of AM1.5 (100 mW/cm$^2$) was applied to the thus-manufactured photoelectric converters, and the photoelectric conversion efficiencies were measured under the conditions of a cell temperature of 25° C. and a cell area of 1 cm$^2$. The measurement results of the photoelectric conversion efficiencies are shown in FIG. 22.

As shown in FIG. 22, all of the photoelectric converters of the examples 133 through 144 exhibited a rectification property, and the conversion efficiency of each photoelectric converter had a high value exceeding 2%. From this fact, a satisfactory pn junction can be provided when the iron sulfide semiconductor of the present invention is employed as the p-type semiconductor.

Moreover, if the examples 136 and 141 through 144 in which the manufacturing conditions of the p-type semiconductor layer 1247 are the same are compared with one another, the photoelectric conversion efficiencies of the examples 141 and 142 that contain none of Al, Ga and In as the dopant of the n-type semiconductor layer 1248 are lower than the photoelectric conversion efficiencies of the examples 136, 143 and 144 that contain at least one of the elements Al, Ga and In as the dopant of the n-type semiconductor layer 1248. From this fact, the photoelectric conversion efficiency can be improved when at least one of the elements Al, Ga and In is contained as the dopant of the n-type semiconductor layer 1248.

Although the photoelectric converter was manufactured by employing the pn junction constituted of the p-type semiconductor of the present invention and the n-type semiconductor containing iron sulfide in the examples 133 through 144, it is, of course, acceptable to manufacture pn junction devices such as diodes, transistors (pnp transistor, npn transistor and pnip transistor) and switches (pnpm switch and pnpn switch) by employing the pn junction constituted of the p-type semiconductor of the present invention and the n-type semiconductor containing iron sulfide. If a pn junction device is manufactured by employing the pn junction constituted of the p-type semiconductor of the present invention and the n-type semiconductor containing iron sulfide, the rectification characteristic of the pn junction device can be remarkably improved, and the device characteristics of the pn junction device can be remarkably improved.

Figure 23:
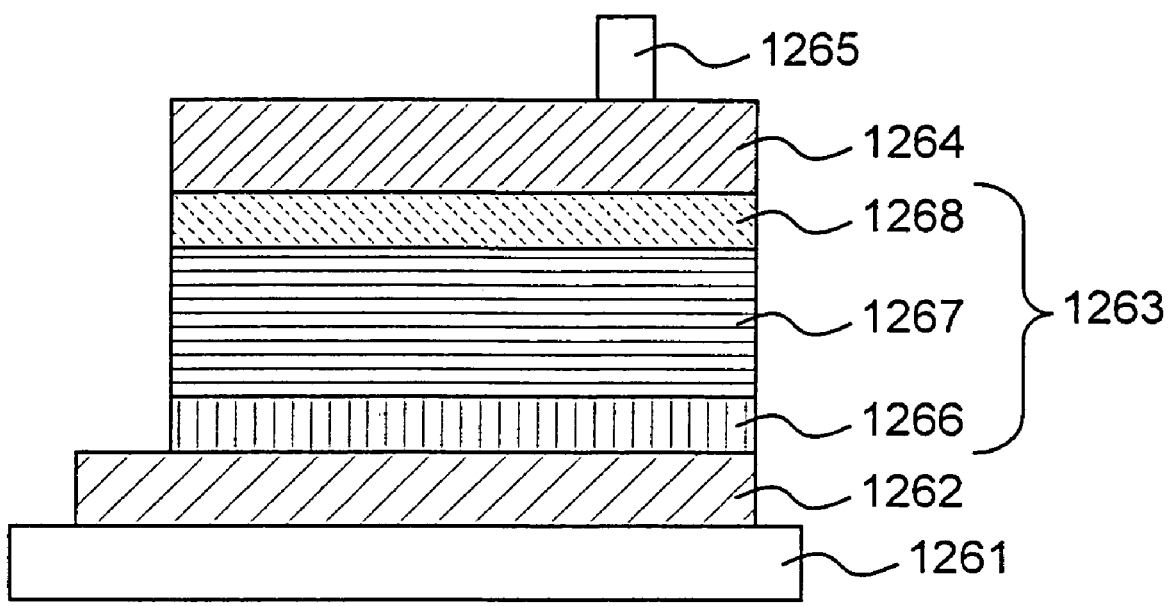
FIG. 23 is a schematic sectional view of the photoelectric converter of one embodiment of the present invention.

FIG. 23 is a sectional view of the photoelectric converter of the examples 145 through 150 of the present invention. FIG. 24 is a table showing the kinds of spray solutions used for manufacturing the photoelectric converters of the examples 145 through 150 of the present invention.

The photoelectric converters of the examples 145 through 150 are described below on the basis of FIGS. 23 and 24.

The photoelectric converters of the examples 145 through 150 are each formed as follows. First of all, an electrode layer 1262 is formed by forming a Pt film having a thickness of 500 nm on a glass substrate 1261 having a film thickness of, for example, 1.1 mm by the vacuum evaporation method. Next, a photoelectric conversion layer 1263 that has a p$^+$-p-n junction of $FeS_2$ pyrite is formed on the electrode layer 1262 by using the spray pyrolysis method and the sulfurization method together. Subsequently, a transparent conductive film 1264 is formed on the photoelectric conversion layer 1263, and thereafter, a grid electrode 1265 is formed on the transparent conductive film 1264, forming a photoelectric converter. The portions other than photoelectric conversion layer 1263 are similar to those of the example 134.

The details of a method for forming the photoelectric conversion layer 1263 are as follows. In forming the p$^+$-p-n type $FeS_2$ pyrite, as shown in FIG. 24, by using solutions obtained by diluting twentyfold the same solutions as those of the examples 127 through 132 of FIG. 22 as spray solutions for the p$^+$-type, the glass substrate 1261, on which the electrode layer 1262 has been layered, is heated to a temperature of about 300° C. on a hot plate in the atmosphere, and a thin film is formed by spray coating of the solution on it. It is confirmed that the peaks of oxide and hydroxide of iron are not observed by subjecting the spray coated thin film to an XRD measurement and it is FeS.

Next, the processed resultant is baked at a temperature of 500° C. for one hour in a sulfur vapor atmosphere. At this time, a sulfur vapor is generated by heating sulfur at a temperature of lower than 200° C. by means of a heater other than the heater for heating the samples, and a nitrogen gas is flowed as a carrier gas at a rate of 5 l/min. It is confirmed that the single phase of $FeS_2$ pyrite is formed by carrying out an XRD measurement after the sulfide treatment. The film thickness was 70 nm in one experimental example.

Subsequently, p-type and n-type FeS2 pyrites are successively produced on p$^+$-type FeS$_2$ pyrite as in the example 134. A photoelectric conversion layer 1263 constituted of the p$^+$-type semiconductor layer 1266 formed on the electrode layer 1262, the p-type semiconductor layer 1267 formed on the p$^+$-type semiconductor layer 1266 and the n-type semiconductor layer 1268 formed on the p-type semiconductor layer 1267 is thus formed.

Subsequently, the transparent conductive film 1264 is formed by depositing n-type gallium-doped zinc oxide (ZnO:Ga) by 700 nm on the photoelectric conversion layer 1263 by the magnetron sputtering method, and thereafter, the grid electrode 1265 is formed by forming a comb-like shape of silver (Ag) on the transparent conductive film 1264 by the magnetron sputtering method. The photoelectric converter shown in FIG. 23 is thus formed.

The present inventor investigated the photoelectric conversion efficiencies of the thus-manufactured photoelectric converters. In concrete, light of AM1.5 (100 mW/cm$^2$) was applied to the thus-produced photoelectric converters, and the photoelectric conversion efficiencies were measured under the conditions of a cell temperature of 25° C. and a cell area of 1 cm$^2$. FIG. 24 shows the measurement results of the photoelectric conversion efficiencies.

Moreover, the thus-manufactured photoelectric converters were subjected to an analysis in the depthwise direction of the group Ia element concentration by SIMS. As a result, it was confirmed that the group Ia element concentrations in the p$^+$-type semiconductor layer and the p-type compound semiconductor layer exhibited values roughly equivalent to that in the case where the semiconductor layer shown in FIG. 20 is singly evaluated.

As shown in FIG. 24, all of the photoelectric converters of the examples 145 through 150 exhibited a rectification characteristic, and the conversion efficiency of each photoelectric converter had a high value exceeding 3%. From this fact, a satisfactory p$^+$-p-n junction can be provided by using the iron sulfide semiconductor of the present invention as a p-type and/or p$^+$-type semiconductor.

Moreover, the photoelectric converter having the pn junction of the example 134, which could be regarded as a p$^+$-p-n junction in the case where the p$^+$-type and p-type group Ia element concentrations were equal to each other, was compared with the example 134 in connection with the examples 145 through 150. Then, it was shown that high photoelectric conversion efficiency could be obtained when the p$^+$-type semiconductor layer had a greater group Ia element concentration than in the p-type semiconductor layer by the comparison of the example 134 with the example 145. Moreover, when the group Ia element concentration in the p$^+$-type semiconductor layer is increased, the photoelectric conversion efficiency is increased. Moreover, a steep increase is observed in the case of the example 146 in which the group Ia element concentration in the p$^+$-type semiconductor layer becomes 20 times that of the p-type semiconductor layer. Therefore, particularly high photoelectric conversion efficiency can be obtained when the group Ia element concentration in the p$^+$-type semiconductor layer is made 20 times the group Ia element concentration in the p-type compound semiconductor layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A semiconductor comprising:
 iron sulfide; and
 a forbidden band control element contained in the iron sulfide, wherein
 the forbidden band control element is Mg that has a property capable of controlling the forbidden band of the iron sulfide on the basis of a number density of the forbidden band control element in the iron sulfide, and
 wherein assuming that a number of Fe atoms is "a" and a number of Mg atoms is "b", then an expression: $0.001 \leq b/a \leq 0.45$ holds.
2. The semiconductor as claimed in claim 1, wherein the iron sulfide contains FeS$_2$ of a pyrite type crystal structure.
3. The semiconductor as claimed in claim 1, comprising a group Ia element.
4. The semiconductor as claimed in claim 3, wherein the group Ia element is Na.
5. The semiconductor as claimed in claim 1, comprising a group III element.
6. The semiconductor as claimed in claim 5, wherein the group III element is Al.
7. A semiconductor junction device comprising the semiconductor claimed in claim 1.
8. A photoelectric converter comprising the semiconductor junction device claimed in claim 7.
9. A pn junction device comprising a pn junction comprising the semiconductor claimed in claim 1.
10. The pn junction device as claimed in claim 9, wherein the device comprises a pn junction constituted of a p-type semiconductor containing iron sulfide and Mg and an n-type semiconductor, and,
 assuming that the forbidden bandwidth of the p-type semiconductor is Eg1 and the forbidden bandwidth of the n-type semiconductor is Eg2, then an expression: Eg1<Eg2 holds.
11. The pn junction device as claimed in claim 10, wherein the n-type semiconductor contains Mg.
12. A photoelectric converter comprising the pn junction device claimed in claim 9.
13. The semiconductor as claimed in claim 1, wherein an expression: $0.005 \leq b/a \leq 0.45$ further holds.
14. The semiconductor as claimed in claim 1, wherein Mg concentration has a height at an interface of the semiconductor and is reduced as located apart from the interface.
15. A semiconductor comprising:
 iron sulfide; and
 a forbidden band control element contained in the iron sulfide, wherein
 the forbidden band control element is Zn that has a property capable of controlling the forbidden band of the iron sulfide on the basis of a number density of the forbidden band control element in the iron sulfide, and
 assuming that a number of Fe atoms is "a" and a number of Zn atoms is "b", then an expression: $0.001 \leq b/a \leq 0.45$ holds.
16. The semiconductor as claimed in claim 15, wherein the iron sulfide contains FeS$_2$ of a pyrite type crystal structure.
17. The semiconductor as claimed in claim 15, comprising a group Ia element.
18. The semiconductor as claimed in claim 17, wherein the group Ia element is Na.

19. The semiconductor as claimed in claim 15, comprising a group III element.

20. The semiconductor as claimed in claim 19, wherein the group III element is Al.

21. A semiconductor junction device comprising the semiconductor claimed in claim 15.

22. A photoelectric converter comprising the semiconductor junction device claimed in claim 21.

23. A pn junction device comprising a pn junction comprising the semiconductor claimed in claim 15.

24. The pn junction device as claimed in claim 23, wherein the device comprises a pn junction constituted of a p-type semiconductor containing iron sulfide and Zn and an n-type semiconductor, and, assuming that the forbidden bandwidth of the p-type semiconductor is Eg1 and the forbidden bandwidth of the n-type semiconductor is Eg2, then an expression: Eg1<Eg2 holds.

25. The pn junction device as claimed in claim 24, wherein the n-type semiconductor contains Zn.

26. The pn junction device as claimed in claim 24, wherein the n-type semiconductor contains an oxide of Zn.

27. A photoelectric converter comprising the pn junction device claimed in claim 23.

* * * * *